United States Patent
Williams et al.

[11] Patent Number: 6,072,216
[45] Date of Patent: Jun. 6, 2000

[54] VERTICAL DMOS FIELD EFFECT TRANSISTOR WITH CONFORMAL BURIED LAYER FOR REDUCED ON-RESISTANCE

[75] Inventors: Richard K. Williams, Cupertino; Wayne Grabowski, Los Altos, both of Calif.

[73] Assignee: Siliconix Incorporated, Santa Clara, Calif.

[21] Appl. No.: 09/071,729

[22] Filed: May 1, 1998

[51] Int. Cl.[7] .................................................. H01L 29/76
[52] U.S. Cl. .......................... 257/339; 257/342; 257/345; 438/289; 438/306; 438/981
[58] Field of Search .................... 257/339, 342, 257/341, 337, 343, 500, 502, 504, 144; 438/301, 305, 306, 217, 289, 981

[56] References Cited

U.S. PATENT DOCUMENTS

| | | | |
|---|---|---|---|
| 4,974,059 | 11/1990 | Kinzer ....................................... | 257/342 |
| 5,623,154 | 4/1997 | Murakami et al. ....................... | 257/345 |
| 5,644,148 | 7/1997 | Kinzer ....................................... | 257/342 |
| 5,661,314 | 8/1997 | Merrill et al. ............................ | 257/339 |
| 5,714,781 | 2/1998 | Yamamoto et al. ...................... | 257/341 |
| 5,742,087 | 4/1998 | Lidow et al. ............................. | 257/339 |
| 5,753,943 | 5/1998 | Okabe et al. ............................. | 257/339 |
| 5,939,752 | 8/1999 | Williams ................................... | 257/339 |

Primary Examiner—Donald L. Monin, Jr.
Attorney, Agent, or Firm—Skjerven, Morrill, MacPherson, Franklin and Friel; David E. Steuber

[57] ABSTRACT

A vertical DMOSFET includes a buried layer which is of the same conductivity type as the drain and which extends into the heavily doped substrate and approaches or extends to the surface of the epitaxial layer at a central location in the MOSFET cell that is defined by the body regions of the MOSFET. In some embodiments the upper boundary of the buried layer generally conforms to the shape of the body region, forming a dish shaped structure under the body region. A significant portion of the current flowing through the channel is drawn into the buried layer and since the buried layer represents a relatively low-resistance path, the total resistance of the MOSFET is lowered without any significant effect on the breakdown voltage. The conformal buried layer can be formed by implanting dopant into the epitaxial layer at a high energy (0.5 to 3 MeV). Before the implant, a thick oxide layer is formed in a central region of the MOSFET cell. The dopant penetrates less deeply into the epitaxial layer under the thick oxide layer, and this yields the "conformal" shape of the buried layer. Alternatively, the buried layer can be formed with two implants, i.e., by forming a horizontal buried layer in the epitaxial layer by a blanket implant and by forming a "plug" by implanting through an opening in a mask layer at the center of the cell, the plug overlapping the horizontal layer.

21 Claims, 24 Drawing Sheets

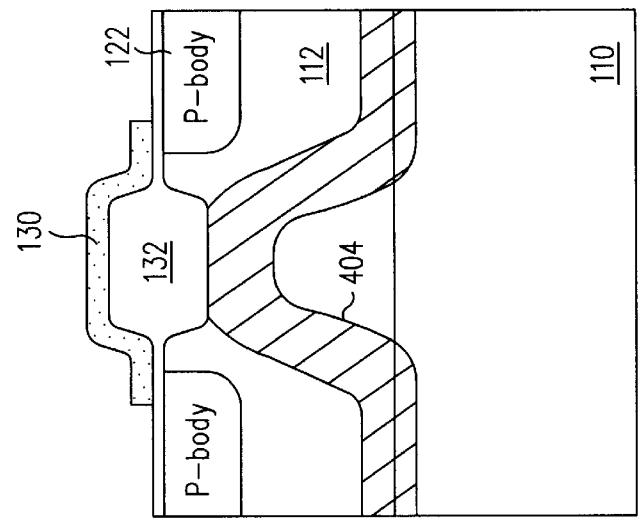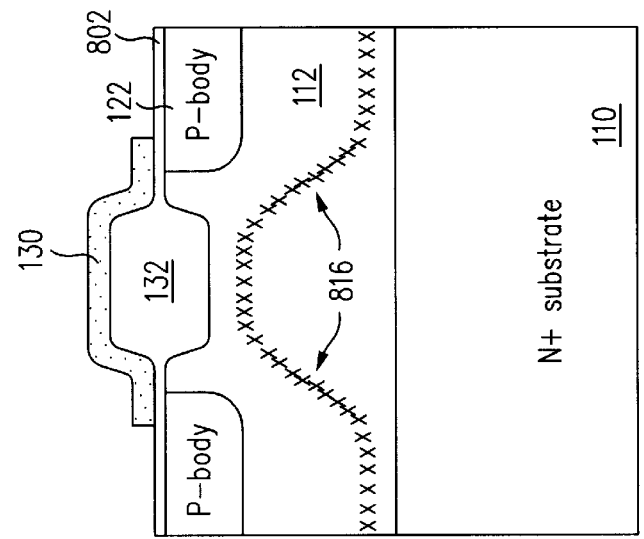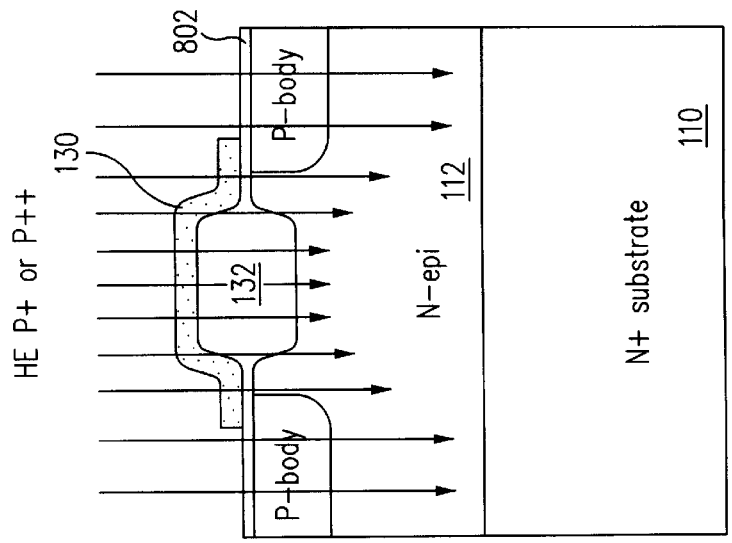

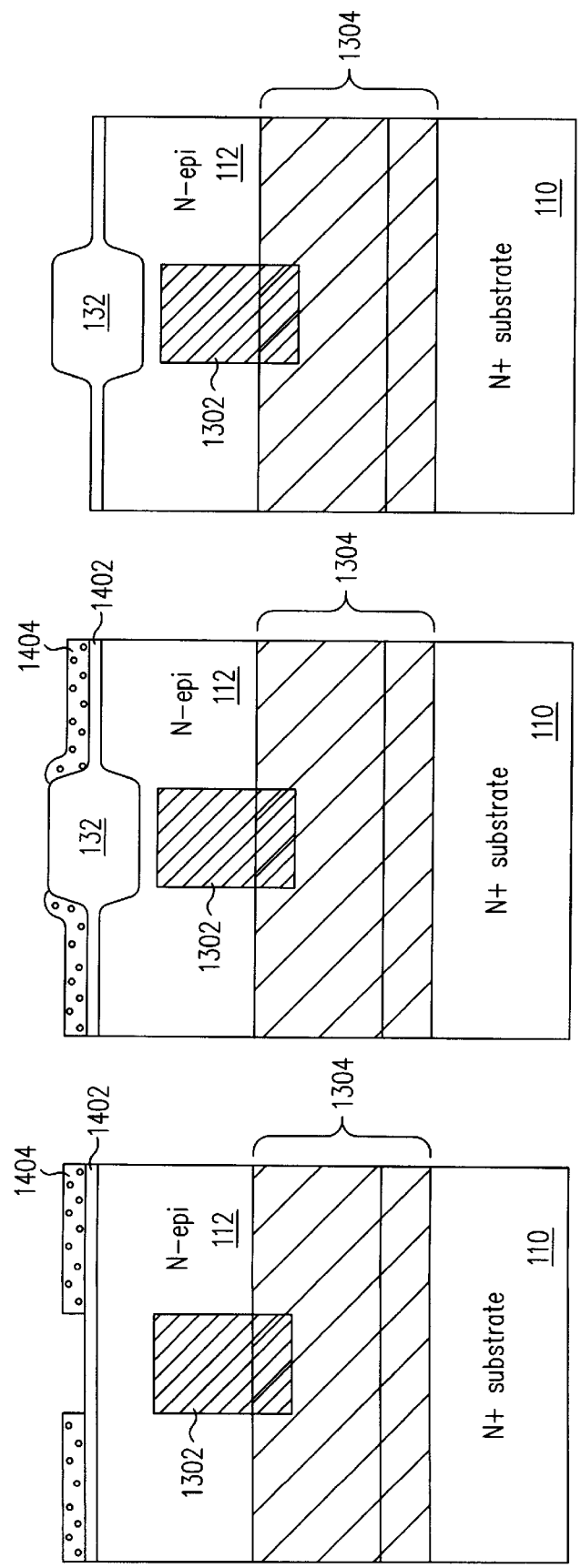

VERTICAL DMOS FIELD EFFECT TRANSISTOR WITH CONFORMAL BURIED LAYER FOR REDUCED ON-RESISTANCE

FIELD OF THE INVENTION

This invention relates to metal-oxide-silicon field-effect transistors (MOSFETs) and in particular to techniques for reducing the on-resistance of a vertical planar power MOSFET, which is a switching element used to control the flow of electrical power to a controlled device.

BACKGROUND OF THE INVENTION

Most commercial uses of power MOSFETs are as electronic "switches". As a switch, there are two key characteristics of a power MOSFET: its breakdown voltage and its on-resistance. Its breakdown voltage is a measure of the MOSFET's ability to withstand voltage when it is in an "off" or "open" condiction, and its on-resistance is a measure of its resistance when it is in an "on" or "closed" condition. To improve the operation of the device as a switch, the objective is to make the breakdown voltage as high as possible and the on-resistance as low as possible. A perfect device would have an infinite breakdown voltage and zero on-resistance.

Several categories of power MOSFETs exist. In vertical devices the current flows generally from contacts on the top surface of a semiconductor die to contacts on the opposite side. One variety of vertical device is the trench-gated MOSFET, wherein the gate is formed in trenches that extend downward from the top surface of the die, and the channel regions are located along the side walls of the trenches. Trenched-gated MOSFETs have several advantages, one of which is that the cell density can be made greater, and this in turn reduces the on-resistance of the device. Despite these advantages, many vertical devices continue to be fabricated with the gate located over the top surface of the die and the body and channel region being formed by two diffusions of opposite conductivity. For this reason, and since the flat top surface of the die remains intact, these are sometimes called vertical planar double-diffused MOSFETs, or vertical planar DMOSFETs.

FIGS. 1A–1C are cross-sectional views of the cells of three types of vertical planar DMOSFETs. Each of the MOSFETs is formed in an epitaxial (epi) layer 112 which is grown over an N+ substrate 110. Epi layer 112 is generally lightly doped with N-type atoms, but as indicated additional N-type atoms or P-type atoms are implanted into certain portions of epi layer 112.

In N-channel DMOSFET 100 shown in FIG. 1A, a polysilicon gate 120 is separated from epi layer 112 by an oxide ($SiO_2$) layer 121. When MOSFET 100 is turned on, current flows vertically from the N+ substrate, which serves as the drain, laterally through a channel region 127 within the P-body 122 adjacent the top surface of epi layer 112, and to an N+ source region 123. The P-body 122 and N+ source region 123 are both self-aligned with the gate 120 and are formed by successive P- and N-type diffusions through the top surface of N-epi layer 112, the former of which is allowed to extend laterally under the gate 120. The P-body 122 and N+ source region 123 are shorted together by means of a metal layer 126 and a P+ body contact region 124. An optional deep P+ region 125 is used primarily to prevent any parasitic NPN bipolar action involving N+ source region 123, P-body 122 and N-type epi layer 112.

MOSFET 102 shown in FIG. 1B is similar to MOSFET 100, but gate 130 is fabricated in a terraced form over a thick oxide layer 132 to reduce the capacitance between gate 130 and epi layer 112 and thereby improve the switching speed of the device. Thick oxide layer 132 is typically formed by a LOCOS (local oxidation of silicon) process, although oxide etchback methods (where the oxide layer is grown, masked and etched) can also be used. The inclusion of the thick oxide layer 132 does not appreciably increase the lateral dimension of the MOSFET because the facing portions of P-body 122 must in any case be separated sufficiently to avoid undue current-crowding the in the central region of the MOSFET cell. This current crowding is not the same as minority carrier crowding in a bipolar junction transistor but is more like that of a pinch resistor in the sense that the majority carrier current must flow between the two P-body diffusions. With a reduced cross-sectional area for the current flow, the corresponding resistance in this region is higher than it would be if the opening (gate dimension) were larger.

MOSFET 104 shown in FIG. 10 is also similar to MOSFET 100, but a shallow N– region 134 is formed adjacent the surface of epi layer 112 between the portions of P-body 123, as described in U.S. Pat. No. 4,642,666 to Lidow et al. (although the corresponding region is designated as an N+ region in that patent). N– region is lightly doped but is still more heavily doped than N-epi layer 112 and thus lowers the resistance in the "neck" or "common conduction" region between the portions of P-body 122. N– region 134 is formed either by implanting N-type dopant from the sides and allowing it to diffuse laterally or by implanting it from the top. While this technique of reducing the on-resistance works quite well for 400–500 V devices it has relatively little impact for devices rated at 100 V or less. With devices rated at 100 V and less the N– region 134 must be doped so heavily to have any effect on resistance that it affects the breakdown of the device and furthermore moves the location of the breakdown towards the surface of the silicon below the gate. Note that the N– region 134 extends between the two facing portions of P-body 122. Breakdown in the location near the juxtaposed N– region 134 and P-body 122 can lead to impact ionization and hot carrier injection and consequent damage to the gate oxide layer.

FIG. 2A is a graph showing the normalized on-resistance $R_{DS}W$ of a vertical DMOSFET as a function of the gate surface dimension $Y_{gate}$ (see FIG. 1A). As $Y_{gate}$ is reduced down to about 3 or 4 $\mu$m the increased cell density causes the on-resistance to decrease. Beyond about 3 or 4 $\mu$m, however, current-crowding in the "JFET" region directly beneath the gate causes the on-resistance to increase rapidly, and this effect predominates over the greater cell density. FIG. 2B shows the ratio of area to gate width (A/W) as a function of $Y_{SB}$, which is the surface dimension of the opening or "doughnut hole" in the polysilicon gate (see FIG. 1A). A/W is a geometrical figure of merit, since it is desirable to minimize the area required to provide a given amount of gate width. A/W falls as $Y_{SB}$ increases until $Y_{SB}=Y_{gate}$, at which A/W begins to rise with increasing $Y_{SB}$. The two curves in FIG. 2B are for $Y_{gate}=5$ $\mu$m and $Y_{gate}=2$ $\mu$m.

FIGS. 2C and 2D are graphs showing the normalized on-resistance $R_{DS}A$ as a function of the gate length $Y_{gate}$ and cell density, respectively. In both cases the on-resistance falls to a minimum after which it begins to rise. In the case of FIG. 2C the rise is primarily the result of current-crowding in the JFET area; in FIG. 2D, the rise is a function of geometry (i.e., the total channel width decreases after the cell density passes the point where $Y_{gate}=Y_{SB}$. The curves in each graph are for $Y_{gate}=5$ $\mu$m and $Y_{gate}=2$ $\mu$m, respectively.

The net effect of FIGS. 2A–2D is that reductions of the on-resistance of a vertical DMOSFET are subject to certain limitations based on cell geometry and current-pinching in the JFET region of the device. The latter is illustrated in FIG. 3A, which is a simulated cross-sectional view of the current in a vertical DMOSFET having a given gate length, and in FIG. 3B, which is a similar view showing the current-crowding which occurs as the gate length is reduced. FIG. 3C is a graph showing the voltage at the cross-section at the center of the MOSFET cell as a function of the distance X below the surface of the silicon. Curve A shows the voltage at the cross-section AA in FIG. 3A and curve B shows the voltage at the cross-section BB in FIG. 3B. In FIG. 3B the voltage rises rapidly just below the silicon surface as a result of current-pinching, and then it rises more gradually as a result of the IR drop in the epitaxial drain. When the gate is wider as in FIG. 3A the voltage rises gradually from the silicon surface. There is no sharp voltage jump below the silicon surface as a result of current-crowding. Despite the lower voltage drop across the JFET pinch region, the magnitude of the voltage drop across the entire device may or may not be larger depending on the magnitude of the channel resistance. FIG. 3C illustrates the equivalent lumped element circuit of the vertical planar DMOSFET in its linear "switch" operating condition. Conduction in the JFET region is actually somewhat complex, since the current spreads laterally before turning to flow vertically through the JFET pinch region.

What is needed is a way to reduce the JFET resistance (i.e., the resistance in the JFET pinch region) and the total resistance of a low voltage MOSFET without adversely affecting the breakdown voltage of the device.

SUMMARY OF THE INVENTION

A vertical power MOSFET according to this invention includes a semiconductor substrate of a first conductivity type; an epitaxial layer generally of the first conductivity type overlying the substrate, the epitaxial layer being doped relatively lightly with dopant of the first conductivity type as compared with the substrate; a MOSFET cell comprising a body region of a second conductivity type opposite to the first conductivity type within the epitaxial layer, the body region being located adjacent a surface of the epitaxial layer and enclosing and defining a central portion of the MOSFET cell, a source region of the first conductivity type enclosed by and forming a junction with the body region, a portion of the body region adjacent the surface of the epitaxial layer comprising a channel region, a drain region of the first conductivity type comprising the substrate; a gate separated from the channel region by a dielectric layer; and a buried layer located within the epitaxial layer and extending into the substrate, the buried layer being of the first conductivity type and having a higher concentration of a dopant of the first conductivity type than a remaining portion of the epitaxial layer, the buried layer having an upper boundary within the epitaxial layer, the upper boundary having a shape such the upper boundary is at a first level below the body region and at a second level at a center of the MOSFET cell, the second level being above the second level.

In one group of embodiments in accordance with this invention, the buried layer generally conforms to the shape of the body region. The buried layer is called a "conformal buried layer" herein. Typically, the conformal buried layer extends into the heavily-doped substrate. The conformal layer may or may not extend to the surface of the silicon. The conformal buried layer may be used with a variety of vertical DMOSFETs including MOSFETs having a planar gate and MOSFETs which have a terraced gate which extends over a thick oxide region to reduce the gate capacitance of the device.

The conformal buried layer reduces the on-resistance of the MOSFET because a significant portion of the current flowing between the body and the substrate selects this path of relatively low resistance, thereby reducing the overall resistance of the device.

In another group of embodiments in accordance with this invention the conformal buried is replaced by a plug and/or a buried layer which likewise provides a low-resistance current path between the body region and the substrate.

Another aspect of this invention is a process for forming a buried layer which may be a conformal buried layer or a plug and/or buried layer. The process includes the steps of providing a semiconductor substrate, the semiconductor substrate being doped with atoms of a first conductivity type to a first concentration level; forming an epitaxial layer on a surface of the substrate; doping the epitaxial layer with atoms of the first conductivity type to a second concentration level lower than the first concentration level; forming a thin layer at a first portion of a surface of the epitaxial layer; forming a thick layer at a second portion of the surface of the epitaxial layer; forming a gate layer over the thick and thin layers; etching the gate layer so as to leave a gate, a first portion of the gate lying over at least a portion of the thick layer and a second portion of the gate lying over a portion of the thin layer; implanting a first dopant of the first conductivity type into the epitaxial layer through the gate, the thick layer and the thin layer; implanting a second dopant of a second conductivity type opposite to the first conductivity type to form a body region; and implanting a third dopant of the first conductivity type to form a source region.

The thin and thick layers can be oxide layers. The first dopant is typically implanted at an energy in the range of 500 keV to 3 MeV, the actual energy being selected such that the range of the implanted dopant produces a buried layer in the desired location. Typically, the implanted buried layer is diffused by a thermal process so that the buried expands to the desired size and location. In one embodiment the amount of diffusion of the conformal buried layer is minimal, because the conformal buried layer is formed after the body region and requires only a short diffusion or rapid thermal anneal to repair implant damage. Conversely, the conformal buried layer may be formed prior to the body region in which case the profile of the conformal buried layer will be substantially altered by the extended body diffusion. When a plug and/or buried layer are used in lieu of a conformal buried layer, two or more high-energy implants may be required to achieve the desired dopant profile.

BRIEF DESCRIPTION OF THE DRAWINGS

FIGS. 8A–8L illustrates the steps of a process for forming the MOSFET of FIG. 4.

FIGS. 15A–15F illustrate a process sequence for forming a terrace-gated MOSFET which is similar to the MOSFET FIG. 4 but contains a uniform buried layer and plug instead of the conformal buried layer.

DESCRIPTION OF THE INVENTION

Figure 4:
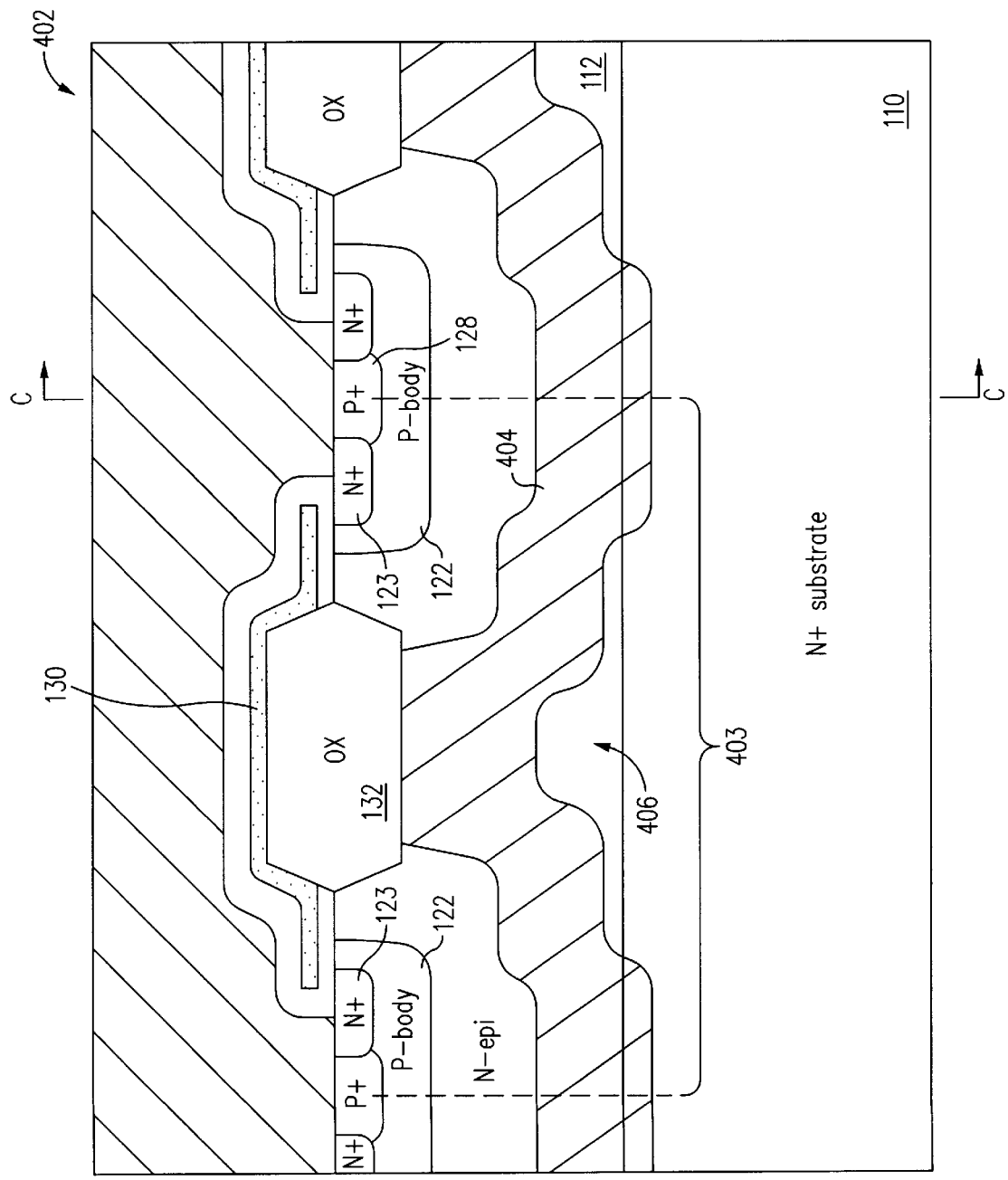
FIG. 4 is a cross-sectional view of a terrace-gated vertical DMOSFET having a conformal buried layer.

An initial embodiment in accordance with the invention is illustrated in the cross-sectional view of FIG. 4. MOSFET 402 is a terrace-gated vertical DMOSFET that is similar to MOSFET 102 shown in FIG. 1B. MOSFET 402, however, additionally includes a conformal N-type buried layer 404 which extends downward from the thick oxide layer 132 and overlaps into the N+ substrate 110. MOSFET 402 includes a MOSFET cell 403 which is defined by the P-body region 102, and P-body region 102 encloses a central portion of the MOSFET cell 403 where the thick oxide layer 132 is located. It will be understood that, assuming a closed cell structure, buried layer 404 forms a sort of dish which underlies and partially encloses the P-body 122 and N+ source region 123 in each MOSFET cell. Thus the upper boundary of buried layer 404 is at a higher level at the center of MOSFET cell 403 than under the P-body region 122.

MOSFET 402 may or may not include a lightly doped N-epi region 406 directly below the field oxide region 132; in some embodiments the bottom edge of conformal buried layer 404 lies wholly within the N+ substrate 110. Buried layer 404 is characterized as "conformal" because it conforms in shape generally to the shape of the P-body 122. Buried layer 404 is thus distinguishable from conventional buried layers which are generally flat, having generally horizontal planar top and bottom edges.

Figure 5:
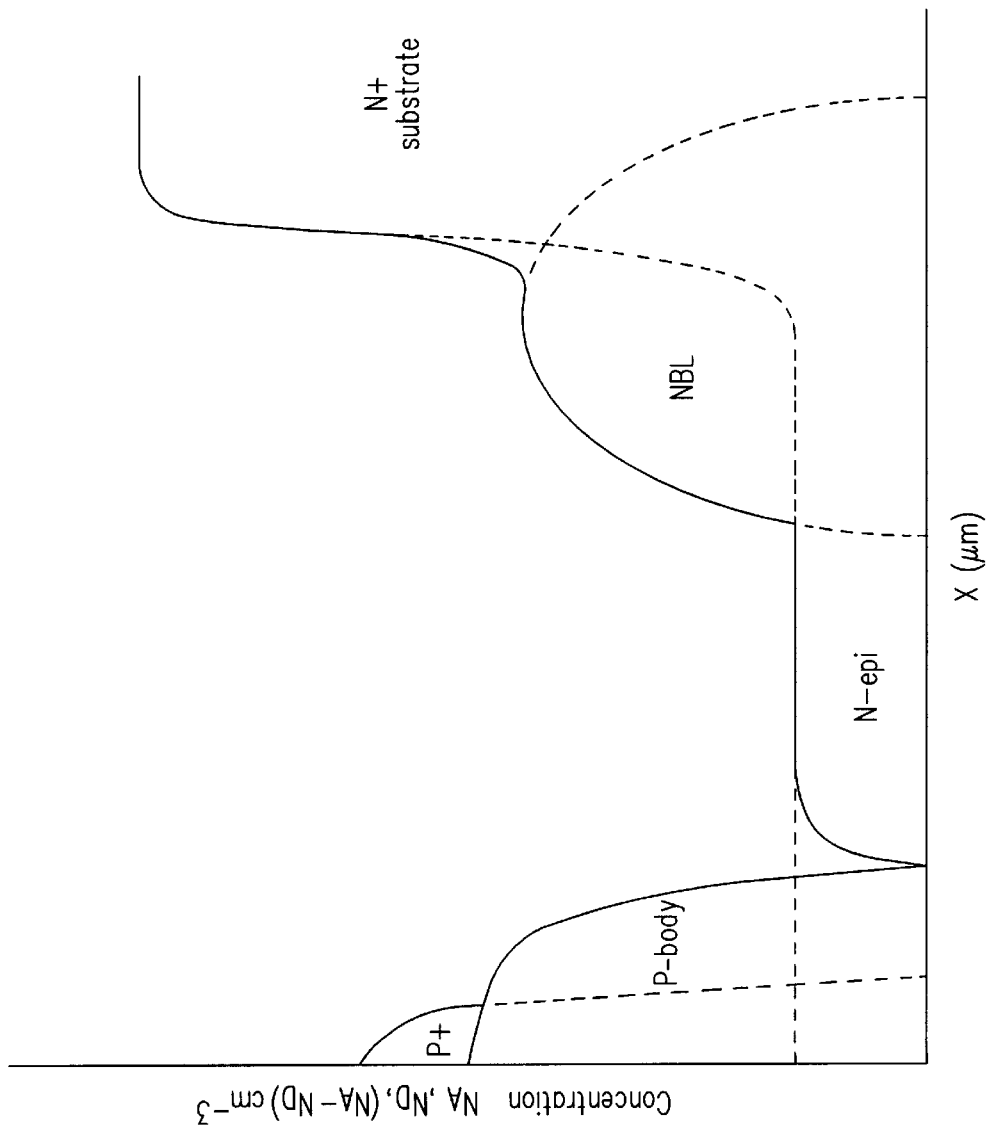
FIG. 5 is a graph showing the dopant concentrations at the vertical cross-section at the center of the body of the MOSFET shown in FIG. 4.

FIG. 5 is a graph showing the dopant concentrations at cross-section CC taken at the center of the P-body 122, which coincides with the edge of the MOSFET cell 403 (see FIG. 4). The P+ body contact region 128 could have a concentration in the range of $5\times10^{18}$ cm$^{-3}$ to $8\times10^{19}$ cm$^{-3}$, for example, and P-body 122 could have surface concentration in the range of $1\times10^{15}$ to $2\times10^{17}$ cm$^{-3}$ (typically around $9\times10^{16}$ cm$^{-3}$) and a depth of from 1 to 3 $\mu$m. The N-epi layer could have a concentration in the range of $8\times10^{15}$ cm$^{-3}$ to $7\times10^{16}$ cm$^{-3}$. The N-buried layer 404 could have a concentration, for example, in the range of $1\times10^{13}$ cm$^{-3}$ to $5\times10^{15}$ cm$^{-3}$. The N+ substrate could have a resistivity of from fractions of an ohm-cm to 1 milliohm-cm.

Figure 6B:
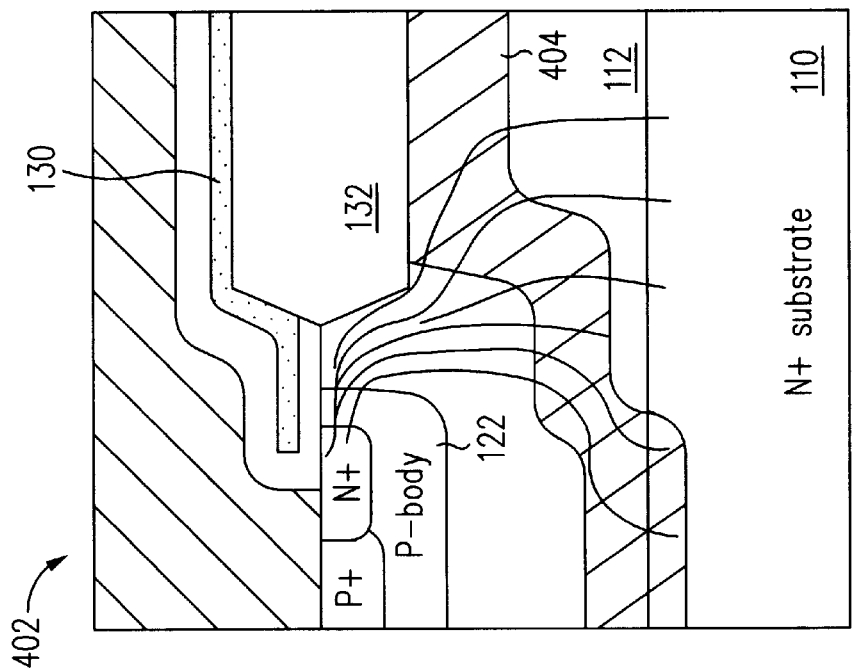
FIGS. 6A and 6B are simulations showing the equipotential contours and current flow lines in the MOSFET of FIG. 4.
Figure 6A:
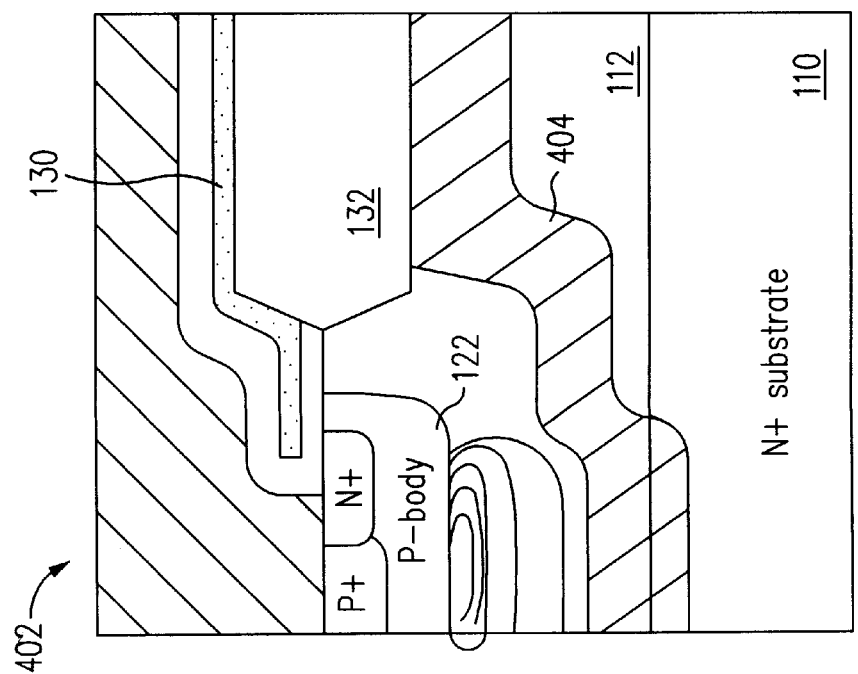

FIGS. 6A and 6B are simulations showing the ionization contours when MOSFET 402 is in an "off" condition near breakdown and the current flow lines when MOSFET 402 is in an "on" condition. FIG. 6A is taken when MOSFET 402 is turned off and FIG. 6B is taken when MOSFET 402 is turned on. The crowding of the ionization contours directly beneath the P-body 122 in FIG. 6A indicates that avalanche breakdown and impact ionization will occur there, far removed from the gate oxide layer where the resulting generation of hot carriers could cause damage. This occurs in part because the upper edge of the buried layer 404 constrains the depletion spreading from the bottom of the P-body and causes avalanche breakdown to take place in this region. This electric field profile can be varied by adjusting the depth of the bottom of the P-body 122. The upper edge of buried layer 404 is determined by its implant energy and subsequent diffusion cycles and the concentration of N-epi layer 112. The thickness of N-epi layer 112 does not affect the breakdown voltage unless N-epi layer 112 is so thin that the breakdown voltage is influenced by an updiffusion of the N+ substrate 110. FIG. 6B shows that the current emerging from the channel flows a short distance in the N-epi layer 112 before it hits the buried layer 404. By a divider effect, a large portion of this current is then drawn through the N-type conformal buried layer 404 and directly into the N+ substrate 110. A substantial portion of the current, once having entered the conformal buried layer 404, never enters the lightly doped N-epi layer 112 again. As a result the total on-resistance of MOSFET 402 is lowered, without significantly affecting the breakdown voltage of the device. Since the breakdown voltage of MOSFET 402 is determined by the net thickness of the N-epi layer 112 between P-body 122 and conformal buried layer 404, the maximum breakdown voltage obtainable with this technique is determined by the practical consideration of the maximum manufacturable implant energy and depth.

Figure 6D:
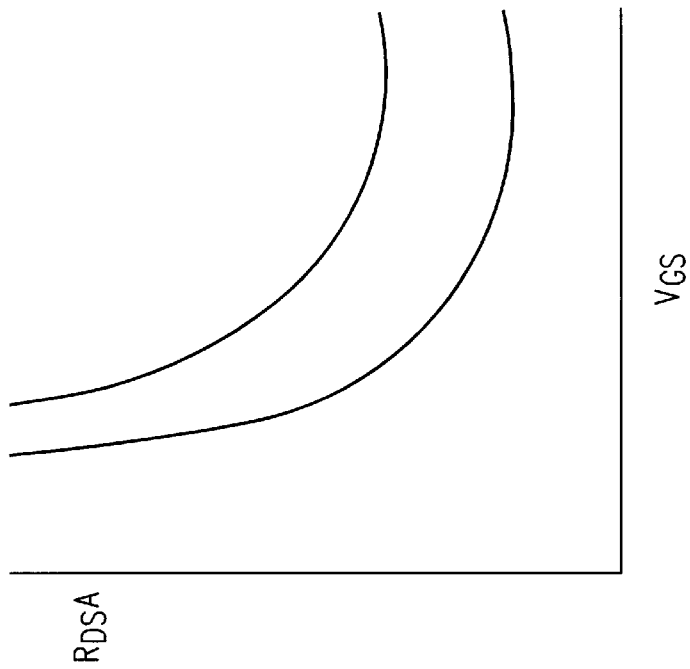
FIG. 6D is a graph of the normalized resistance as a function of the gate drive voltage for the MOSFET of FIG. 4 as compared with a MOSFET which does not contain a conformal buried layer.
Figure 6C:
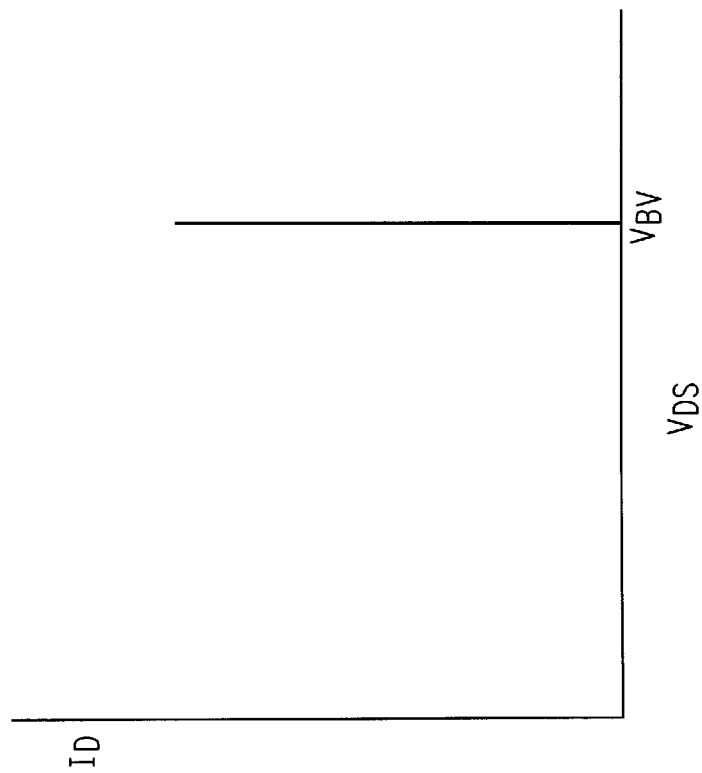
FIG. 6C is a graph of the drain current as a function of the source-to-drain voltage in the MOSFET of FIG. 4, with the gate turned off.

FIG. 6C is a graph of the drain current $I_D$ as a function of the source-to-drain voltage $V_{DS}$ in MOSFET 402, with the gate turned off. As indicated, MOSFET 402 remains non-conductive until the breakdown voltage $V_{BV}$ is reached. FIG. 6D is a graph of the normalized resistance $R_{DS}A$ as a function of the gate drive voltage $V_{GS}$ for MOSFET 402 as compared with a MOSFET (such as MOSFET 102 shown in FIG. 1B) which does not contain the conformal buried layer 404.

Figure 7:
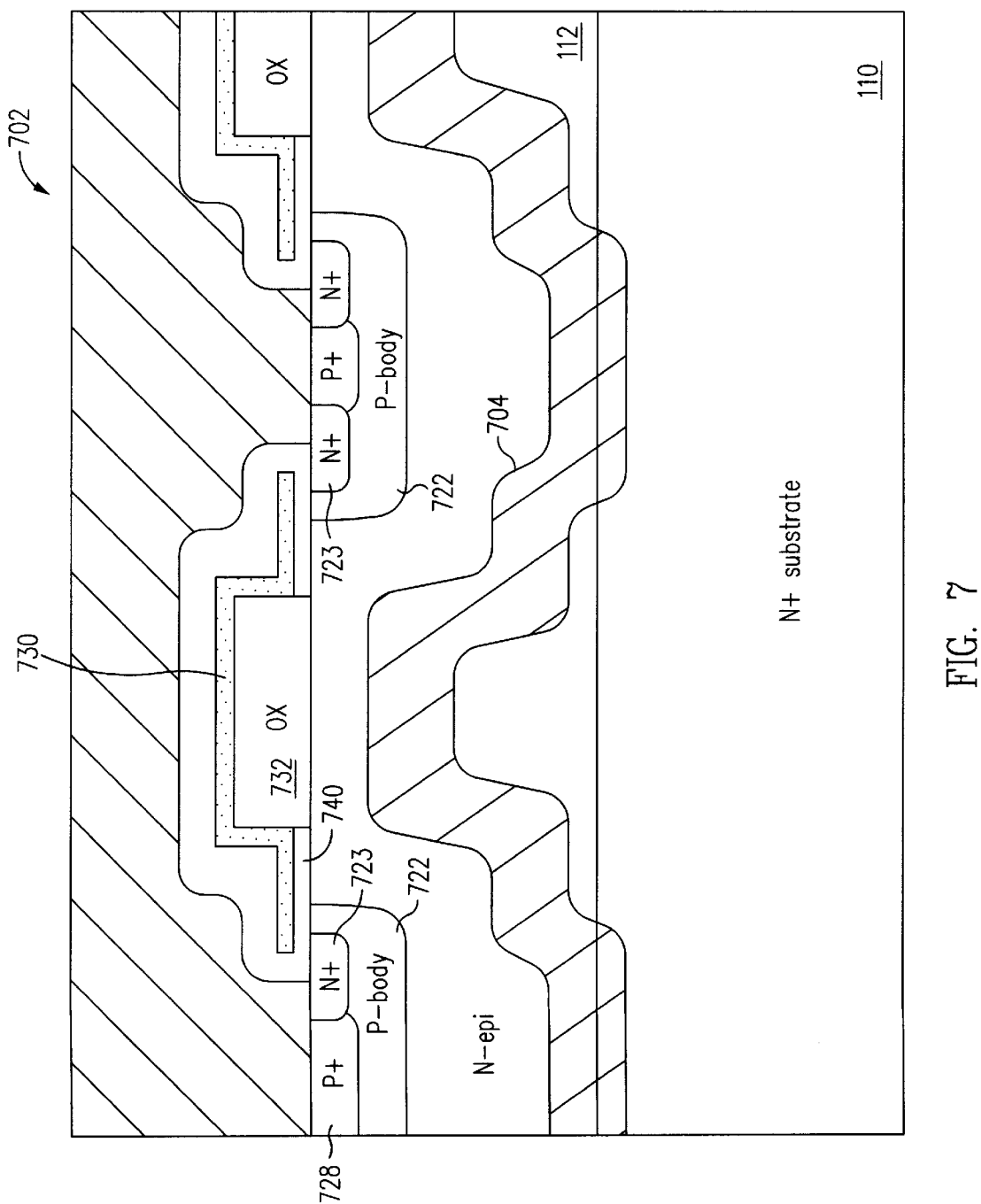
FIG. 7 is a cross-sectional view of a second embodiment of the invention wherein the conformal buried layer does not reach the surface of the epi layer and the terraced gate is formed over a thick oxide layer which has steep edges.

FIG. 7 is a cross-sectional view of a second embodiment of the invention. In MOSFET 702 the conformal buried layer 704 does not reach the surface of the epi layer 112, and the terraced gate 730 is formed over a thick oxide layer 732 which has steep edges. Oxide layer 732 is formed by an etch-based process, in contrast to the LOCOS-based process that is used to grow thick oxide layer 132 and yields the "bird's beak" or angular edge evident in FIGS. 1B and 4. Note that the degree of conformality of the buried layer 704 to the P-body 722 depends on the process sequence. Atoms that are implanted through the polysilicon gate 730 and field oxide 732 produce an upper edge of buried layer 704 closest to the surface of N-epi layer 112 while atoms that are implanted through P-body region 722 produce the deepest region of buried layer 704. If the polysilicon gate 730 is present during the formation of the buried layer 704, the portion of gate 730 overlying the gate oxide layer 740 will produce a portion of buried layer 704 that is intermediate in depth between the deep portion of buried layer 704 under P-body 722 and the shallow portion of buried layer 704 under field oxide region 732. If the implant used to form buried layer 704 precedes the formation of the polysilicon gate 730, this intermediate level of the buried layer 704 would not be present.

A process for forming a MOSFET similar to MOSFET 402 shown in FIG. 4 is illustrated in FIGS. 8A–8L.

Figure 8C:
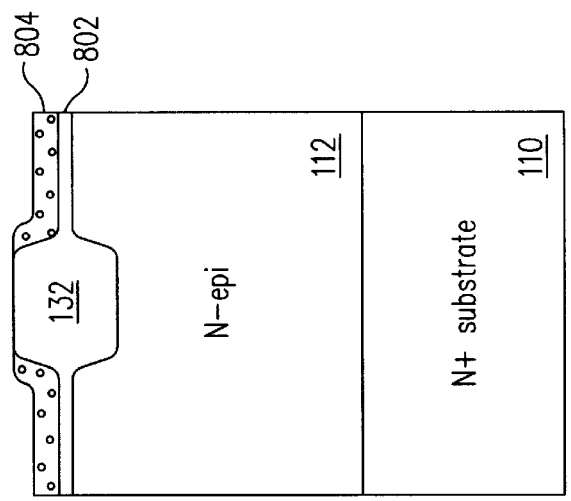
Figure 8B:
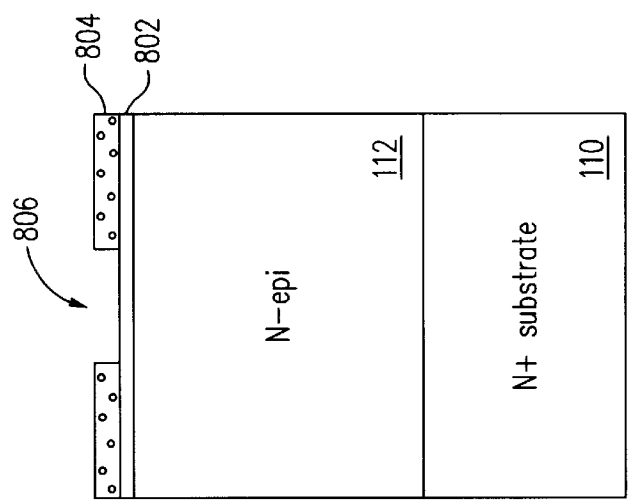
Figure 8A:
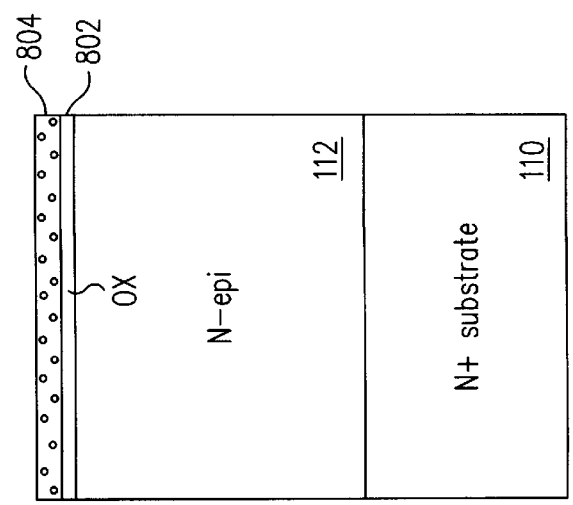

As shown in FIG. 8A, the process starts with an N+ substrate 110 which could be on the order of 20 mils thick. N+ substrate 110 is doped to a concentration from $8 \times 10^{19}$ cm$^{-3}$ to $1 \times 10^{20}$ cm$^{-3}$ and typically has a resistivity of from 1 to 3 milliohm-cm. N-epi layer 112 is grown on the surface of N+ substrate 110 to a thickness of from 1 to 10 μm, typically in the range of 5 to 7 μm. Then an oxide layer 802 is grown to a thickness of, for example, 500 Å by heating in an oxidizing environment at 900° C. for 30 minutes. A silicon nitride layer 804 is deposited on oxide layer 802 to a thickness of from 1000 Å to 5000 Å by means of a chemical vapor deposition process. As shown in FIG. 8B, nitride layer 804 is masked and etched to form a hole 806 and expose a portion of the surface of oxide layer 802. This is followed by a local oxidation of silicon (LOCOS) process which could be carried out in a steam or dry environment at 900° to 1100° C. for from 30 minutes to 3 or 4 hours. This produces the thick oxide layer 132 shown in FIG. 8C, with the familiar tapered "bird's beak" formation at the edges of oxide layer 132 where the nitride layer 804 lifts up during the oxidation process. The thickness of oxide layer 132 may range from 2000 Å to 2 μm, with 0.5 μm being common.

Figures 8D, 8E, 8F:
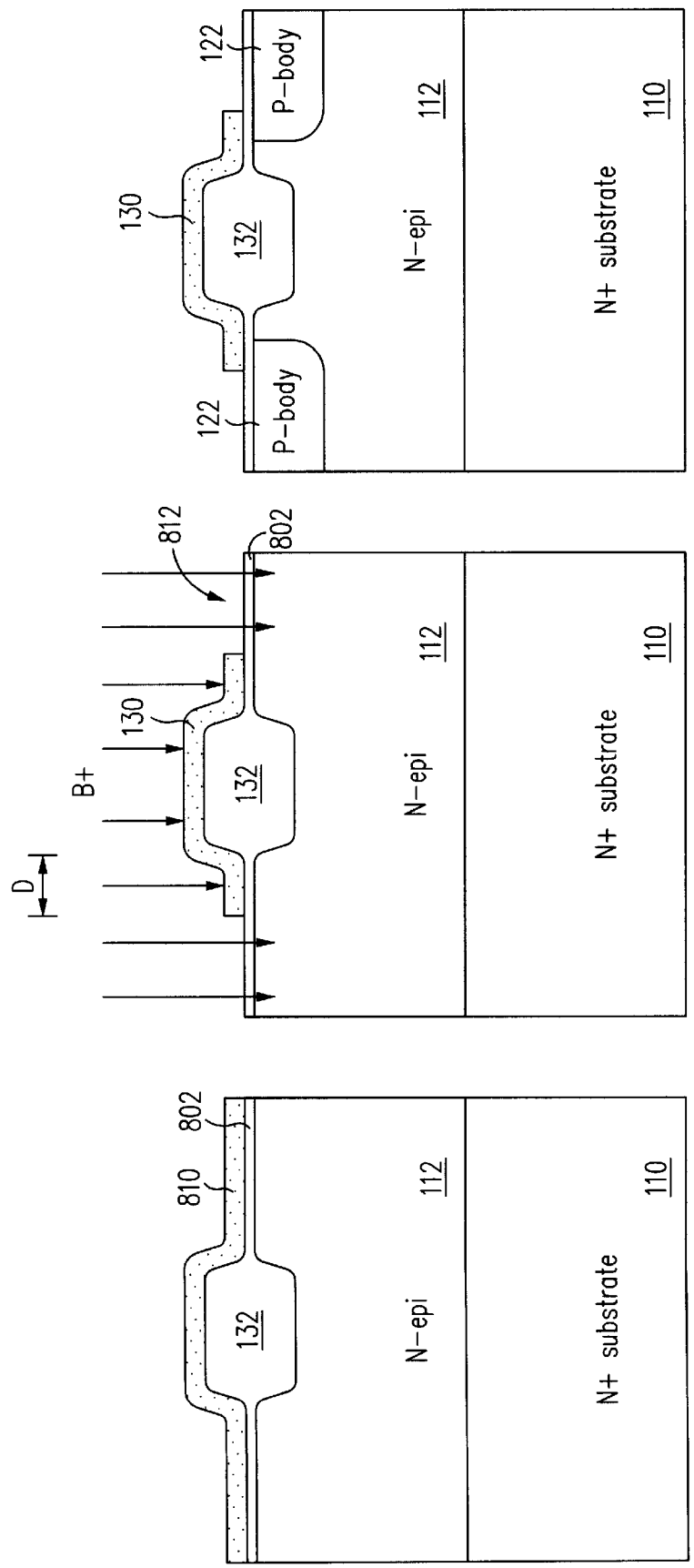
Figure 8L:
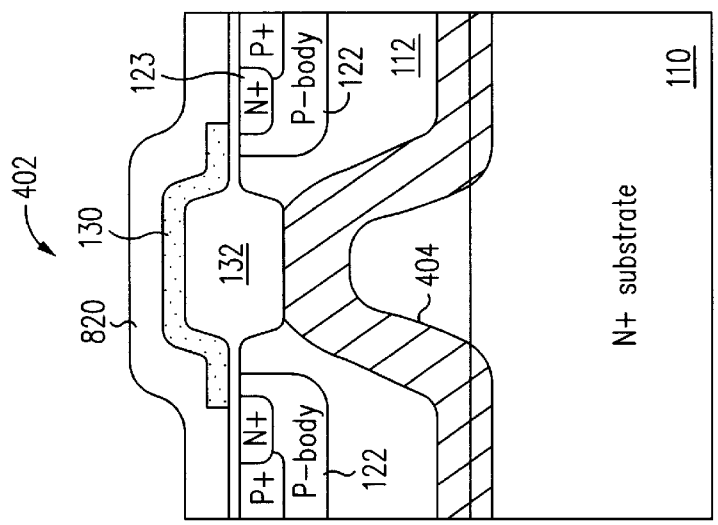

As shown in FIG. 8D, nitride layer 804 is stripped, and a polysilicon layer 810 is deposited to a thickness of from 3000 Å to 7000 Å (preferably about 5000 Å) using a chemical vapor deposition process. Polysilicon layer 810 is doped with phosphorus oxichloride (POCl$_3$) to a resistivity of about 25 to 50 ohms/cm$^2$, although polysilicon layer 810 could also be doped "in situ" during deposition. As shown in FIG. 8E, layer 810 is masked and etched to form polysilicon gate 130, producing holes 812 where the source-body regions will be formed. The lateral extent of the polysilicon gate 130 over the thin oxide layer 802 (dimension D in FIG. 8E) is typically from 1 to 2 μm. Boron is implanted at a dose of $1 \times 10^{13}$ cm to $2 \times 10^{14}$ cm$^{-2}$ and at an energy of from 20 to 120 keV (illustratively 60 keV), and the boron is driven in to a depth of from 1 to 3.5 μm at a temperature of from 1050° to 1150° C. with 1100° C. being typical. The drive-in step could be performed for from 4 to 12 or 15 hours, depending on the temperature used. This process produces P-body regions 122 shown in FIG. 8F.

As shown in FIG. 8G, the structure of FIG. 8F is subjected to a high-energy implant of phosphorus (preferably singly or doubly ionized). The implant is performed at a concentration of $1 \times 10^{13}$ cm$^{-2}$ to $5 \times 10^{15}$ cm$^{-2}$ and at an energy sufficient to provide the dopant profile 816 shown in FIG. 8H. This could be anywhere from 500 keV to 3 MeV, but in most cases the implant is carried out at from 1.5 to 2 MeV. The depth of the phosphorus implant will be several microns in the areas that are not overlain by the thick oxide layer 132 or polysilicon gate 130. The range of the phosphorus implant will be much less in the areas that are overlain by the thick oxide layer 132 and polysilicon gate 130, and will reach an intermediate level in areas that are overlain only by the polysilicon layer 130. The result is to give dopant profile 816 having a conformal shape around the P-body regions 122. The damage to the silicon from this implant is due mostly to atomic rather than coulombic stopping, so the amount of damage is minimal except near the cinter of the buried layer (see FIG. 8H). Subsequent anneals can remove damage for implant doses below $2 \times 10^{14}$ cm$^{-2}$, but above that dose level crystal defects may form. At doses above $1 \times 10^{15}$ cm$^{-3}$ the damage seems to be stable and can lead to gettering of metallic impurities out of the active device regions (N+ source 123 and P-body 122) and into the buried layer 404, beneficially reducing leakage (since no depletion region extends through the buried layer 404). What crystalline damage and amorphosization there is can be repaired, and the dopant can be activated, by an anneal at from 900° to 1100° C. for from 30 minutes to 2 hours. This causes the dopant profile 816 to diffuse upward and downward and yields the conformal buried layer 404 shown in FIG. 8I, which extends upward to the thick oxide layer 132 and downward into the N+ substrate 110.

According to studies of high-energy implants, when defects are formed that are both grow and cannot be repaired through annealing, the defects tend to propagate downward into the N+ substrate 110. N+ substrate 110 lies outside the active area of the device, and the presence of defects in N+ substrate 110 does not normally create significant adverse electrical effects.

Figure 8K:
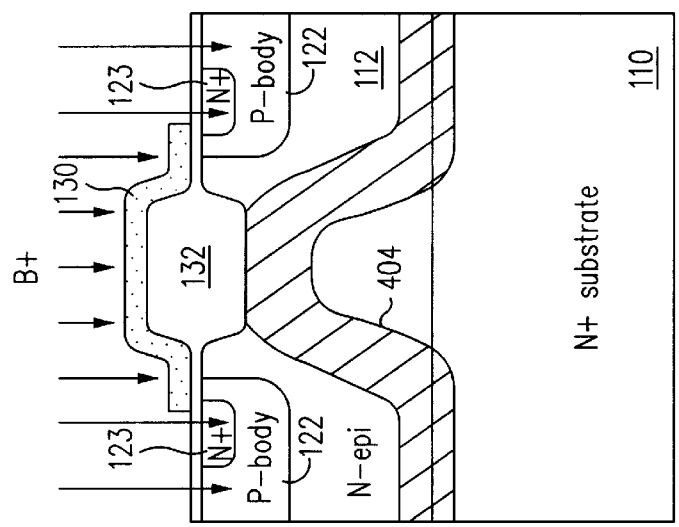
Figure 8J:
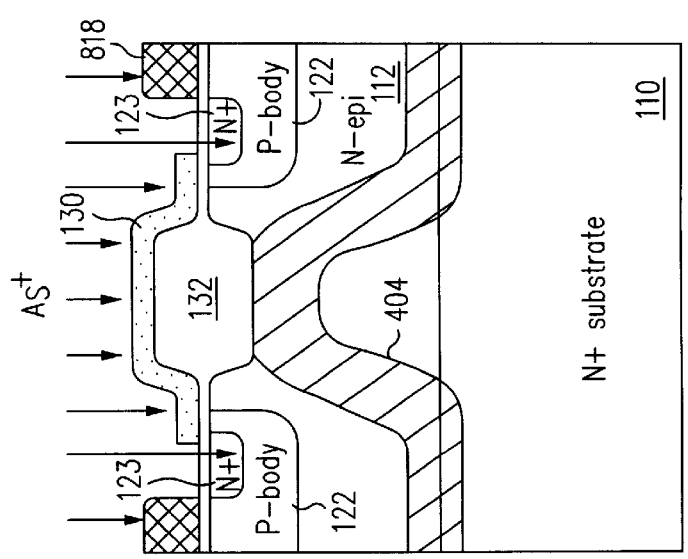

As shown in FIG. 8J, a photoresist layer 818 is deposited and patterned to define the locations of the N+ source regions 123, except that photoresist layer need not be formed over the polysilicon gate 130. Arsenic is implanted at a dose of from $3 \times 10^{15}$ cm$^{-2}$ to $7 \times 10^{15}$ cm$^{-2}$ at an energy of from 70 to 150 keV to form N+ source regions. The arsenic is blocked by the photoresist layer 818 as well as the polysilicon gate 130. Photoresist layer 818 is stripped, as shown in FIG. 8K, and boron is implanted at a dose of from $5 \times 10^{14}$ cm$^{-2}$ to $5 \times 10^{15}$ cm$^{-2}$ and at an energy of 20 to 80 keV ($1 \times 10^{15}$ cm$^{-2}$ and 60 keV being typical) to form P+ body contact regions 128 shown in FIG. 8L. While the arsenic dopant also enters the N+ source regions 123, it does so in low concentrations which do not substantially affect the surface concentration of the N+ source regions 123. An oxide layer 820 is grown (e.g., 30 minutes at 900° C.) or deposited, and optionally another layer (not shown) of, for example, doped borophosphosilicate glass can be deposited to a thickness of from 0.3 to 1 μm to help smooth out the topography of the top surface shown in FIG. 8L. Next, a contact mask is used to open a hole in the oxide layer 820 to expose the N+ source and P+ body contact regions 123 and 128, and a metal layer, e.g., aluminum copper silicon (aluminum with a low percentage of copper and silicon added) 1 to 4 μm thick, is laid down and patterned. A passivation layer of, for example, silicon nitride or oxide may then be formed over the entire top surface of the structure.

Figure 9B:
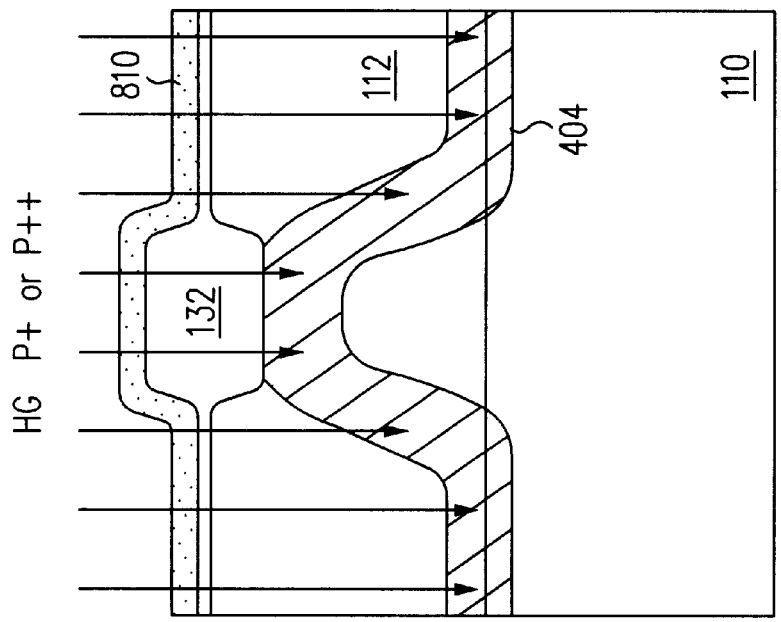
FIGS. 9A and 9B show two variations of the process illustrated in FIGS. 8A–8L.
Figure 9A:
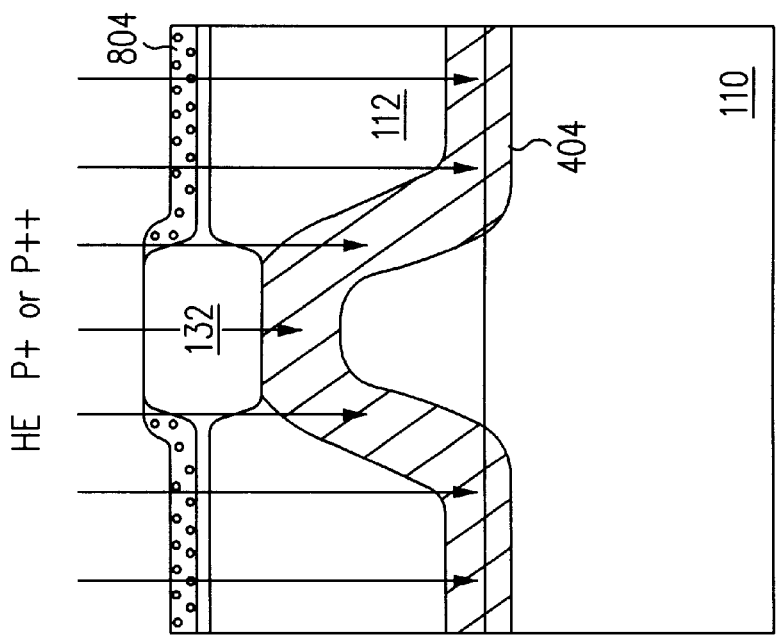

FIGS. 9A and 9B show two variations of the process illustrated in FIGS. 8A–8L. In FIG. 9A the high-energy implant that is used to form the conformal buried layer 404 is performed after the thick oxide layer 132 has been formed and while the nitride layer 804 remains in place (see FIG. 8C); and in FIG. 9B, high energy implant is performed after the polysilicon layer 810 is been deposited but before polysilicon layer 810 has been patterned and etched to form gate 130 (see FIG. 8D).

Figure 10C:
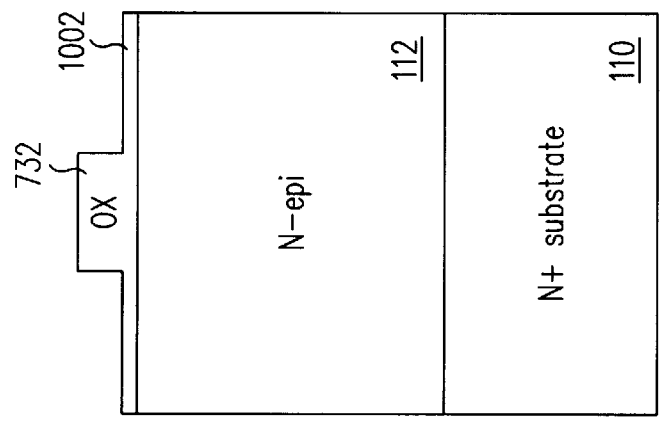
FIGS. 10A–10C illustrate the steps of a process for forming the MOSFET of FIG. 7.
Figure 10B:
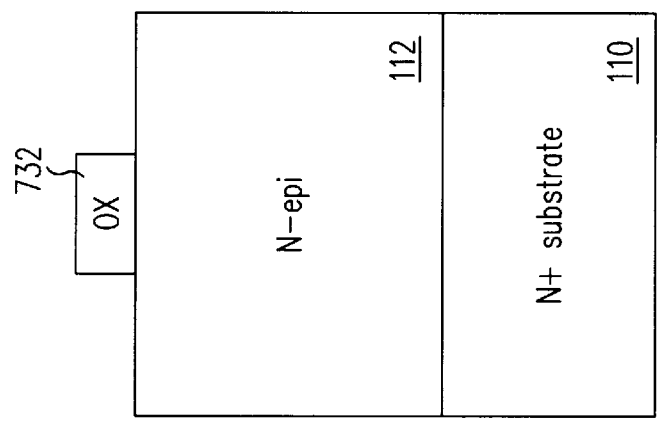
Figure 10A:
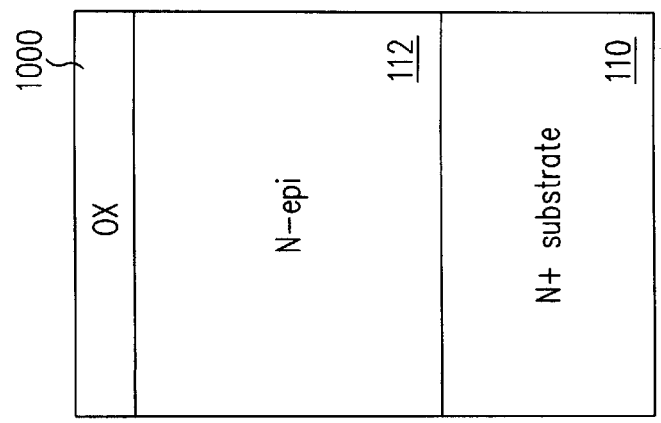

MOSFET 702 shown in FIG. 7 can be fabricated by replacing the process steps shown in FIGS. 8A–8C with those shown in FIGS. 10A–10C. A thick oxide layer 1000 is grown to a thickness of from 1000 Å to 3 μm on the top surface of N-epi layer 112, as shown in FIG. 10A, by oxidation for 1 to 6 hours at 900° to 1150° C. Oxide layer 1000 is masked, patterned and etched to form oxide layer 732, as shown in FIG. 10B, and then a gate oxide layer 1002 is grown, as shown in FIG. 10C. After this, the process steps illustrated in FIGS. 8D et seq. are performed until MOSFET 702 is fabricated.

Figure 11:
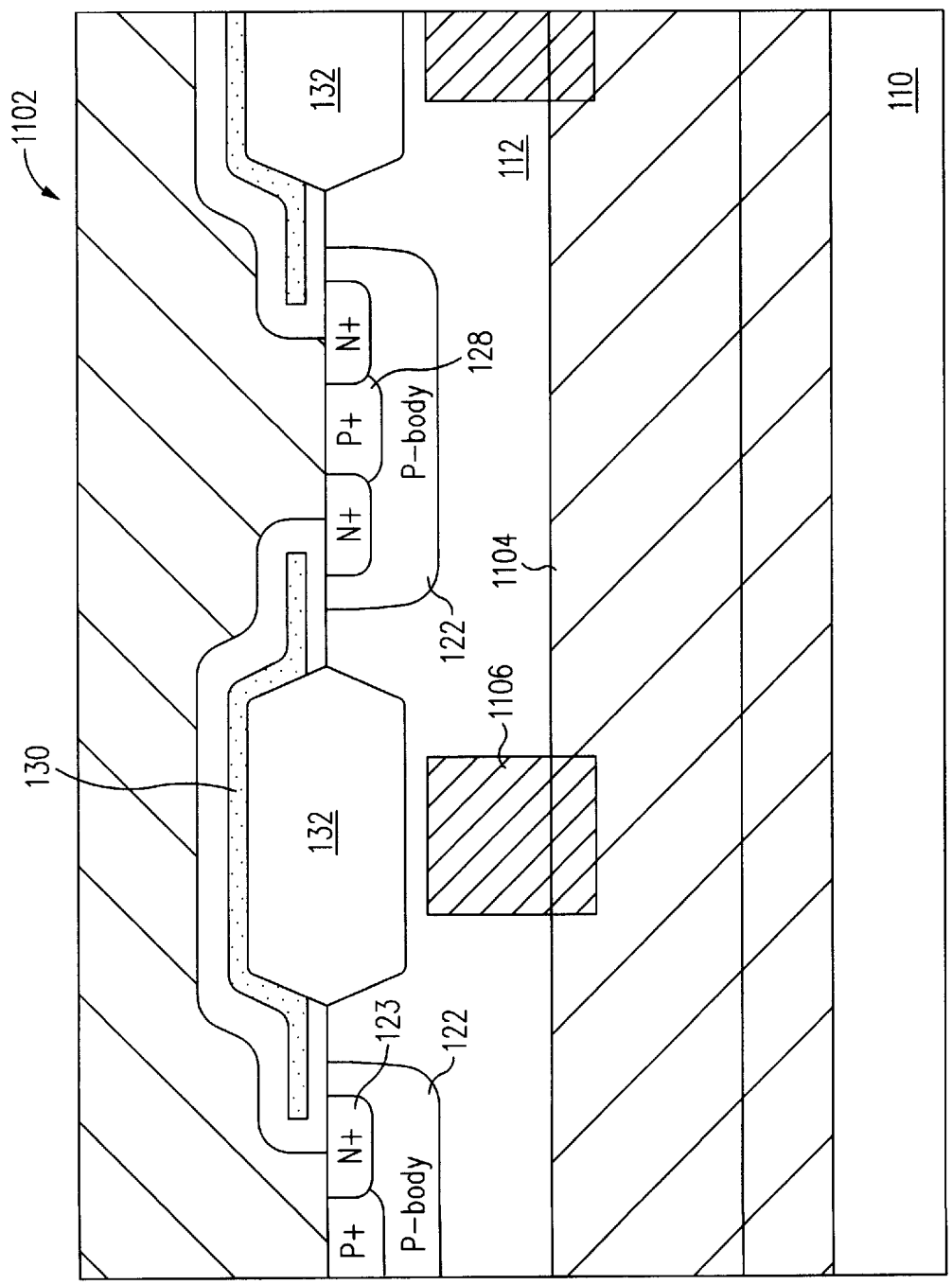
FIG. 11 is a cross-sectional view of an embodiment which is similar to the MOSFET of FIG. 4, except that a uniform buried layer and plug have been substituted for conformal buried layer.

FIG. 11 is a cross-sectional view of a third embodiment which is similar to the terrace-gated DMOSFET 402 of FIG. 4, except that in MOSFET 1102 an N-type uniform buried layer 1104 and an N-type plug 1106 have been substituted for conformal buried layer 404. Uniform buried layer overlaps into the N+ substrate 110, and plug 1106 overlaps uniform buried layer 1104 and is located directly below the thick oxide layer 132. In some embodiments uniform buried layer 1104 can be omitted and in such cases plug 1106 may extend into the N+ substrate 110.

Figures 1A, 1B:
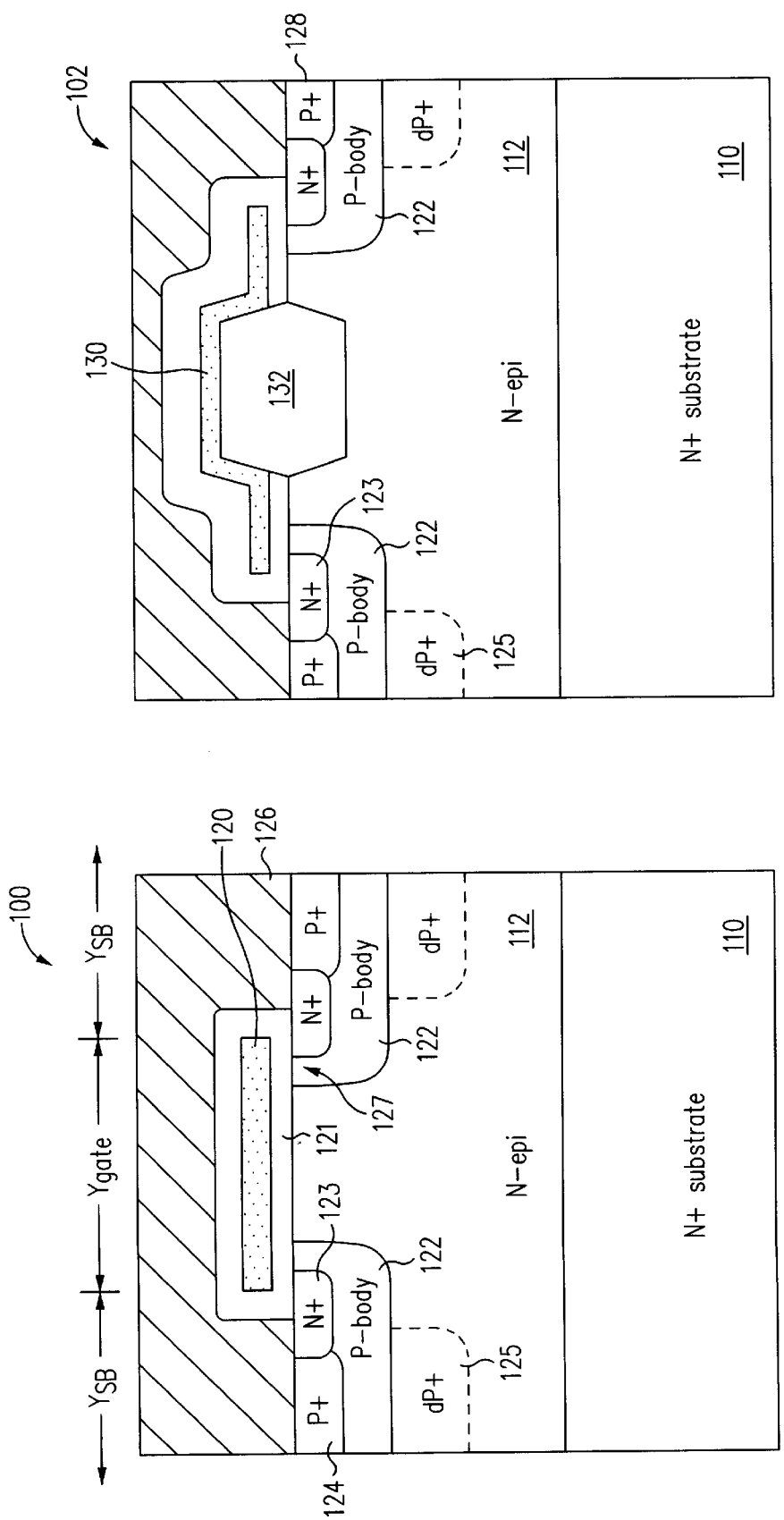
FIG. 1A illustrates a cross-sectional view of a conventional vertical planar DMOSFET.
FIG. 1B illustrates a cross-sectional view of a conventional vertical terrace-gated DMOSFET.
Figure 1C:
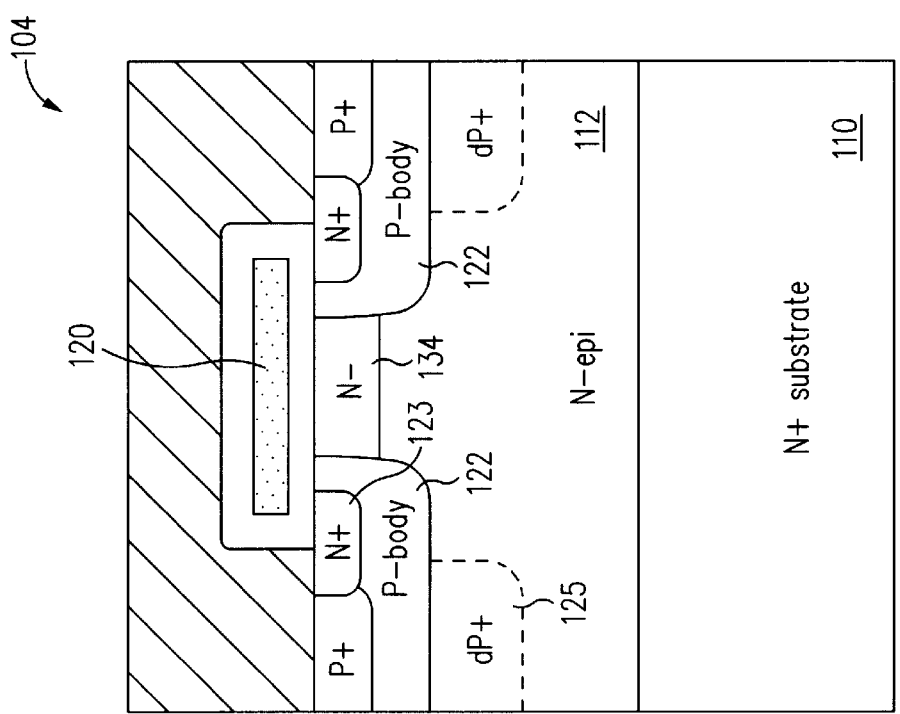
FIG. 1C illustrates a cross-sectional view of a conventional vertical planar DMOSFET having a shallow lightly doped region between the body diffusions.
Figure 2B:
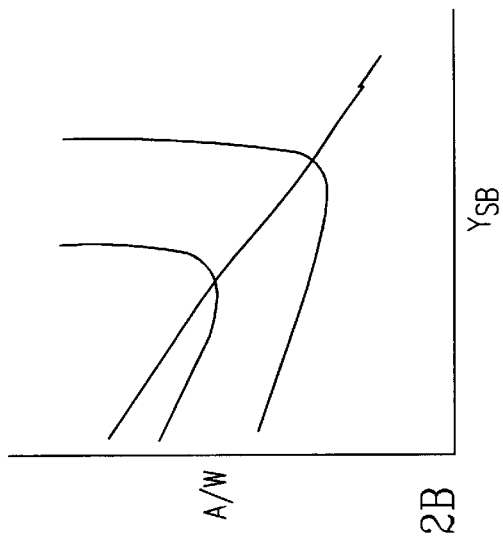
FIG. 2B is a graph showing the ratio of area to gate width A/W as a function of the source-body width in a vertical DMOSFET.
Figure 2D:
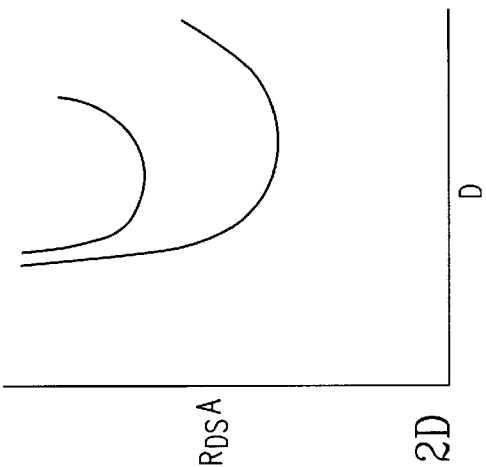
FIGS. 2C and 2D are graphs showing the normalized on-resistance of a vertical DMOSFET as a function of the gate length and cell density, respectively.
Figure 2A:
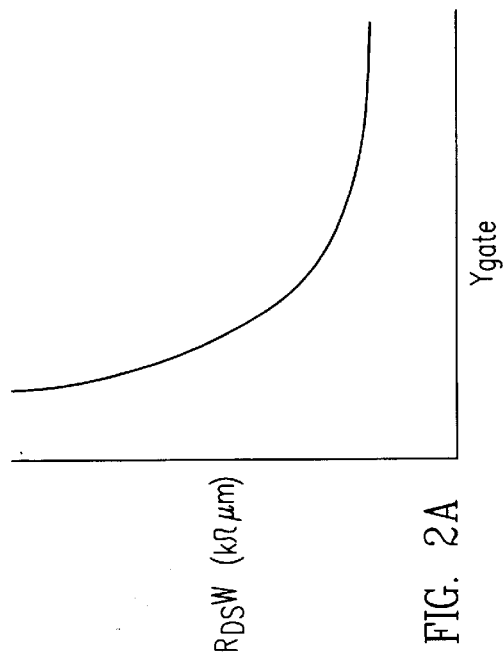
FIG. 2A is a graph showing the normalized on-resistance of a vertical DMOSFET as a function of gate length.
Figure 2C:
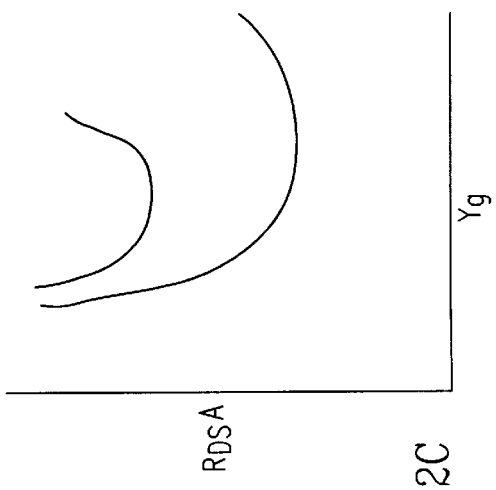
Figure 3B:
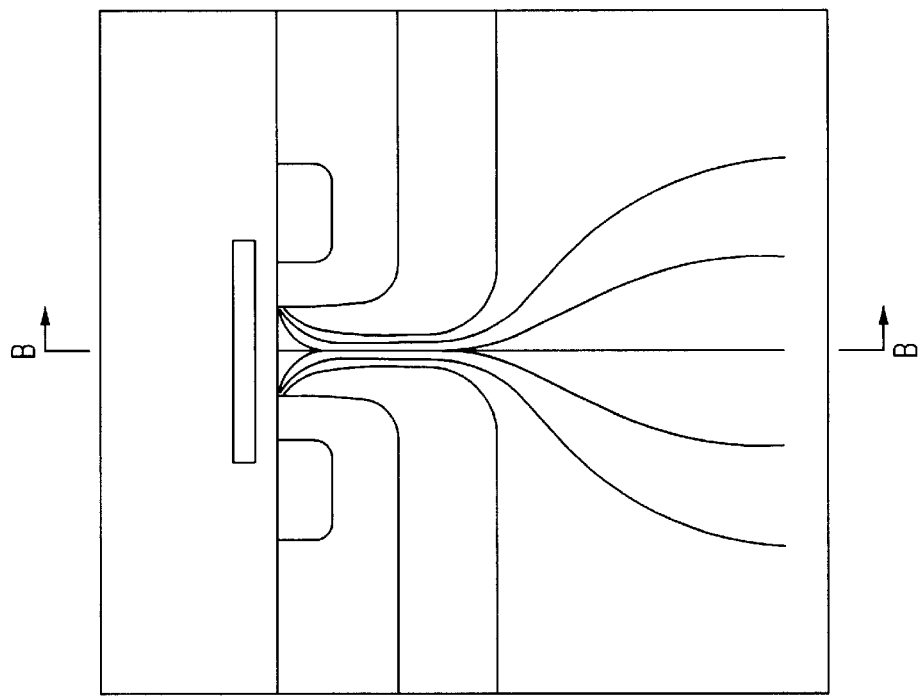
FIG. 3B is a similar view showing the current crowding which occurs as the gate length is reduced.
Figure 3A:
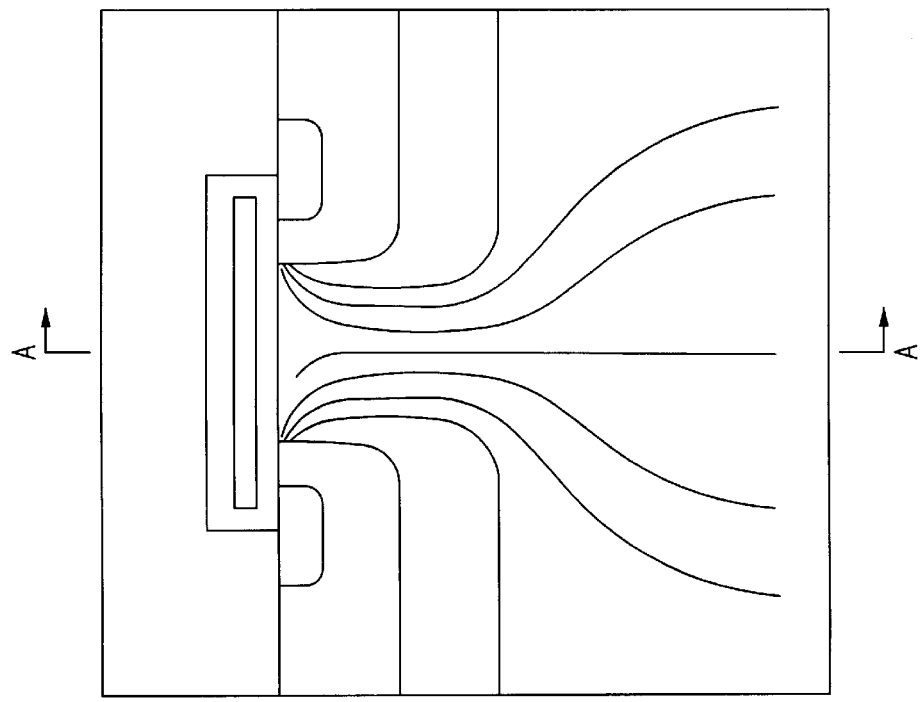
FIG. 3A is a simulated cross-sectional view of the current in a vertical DMOSFET having a given gate length.
Figure 3C:
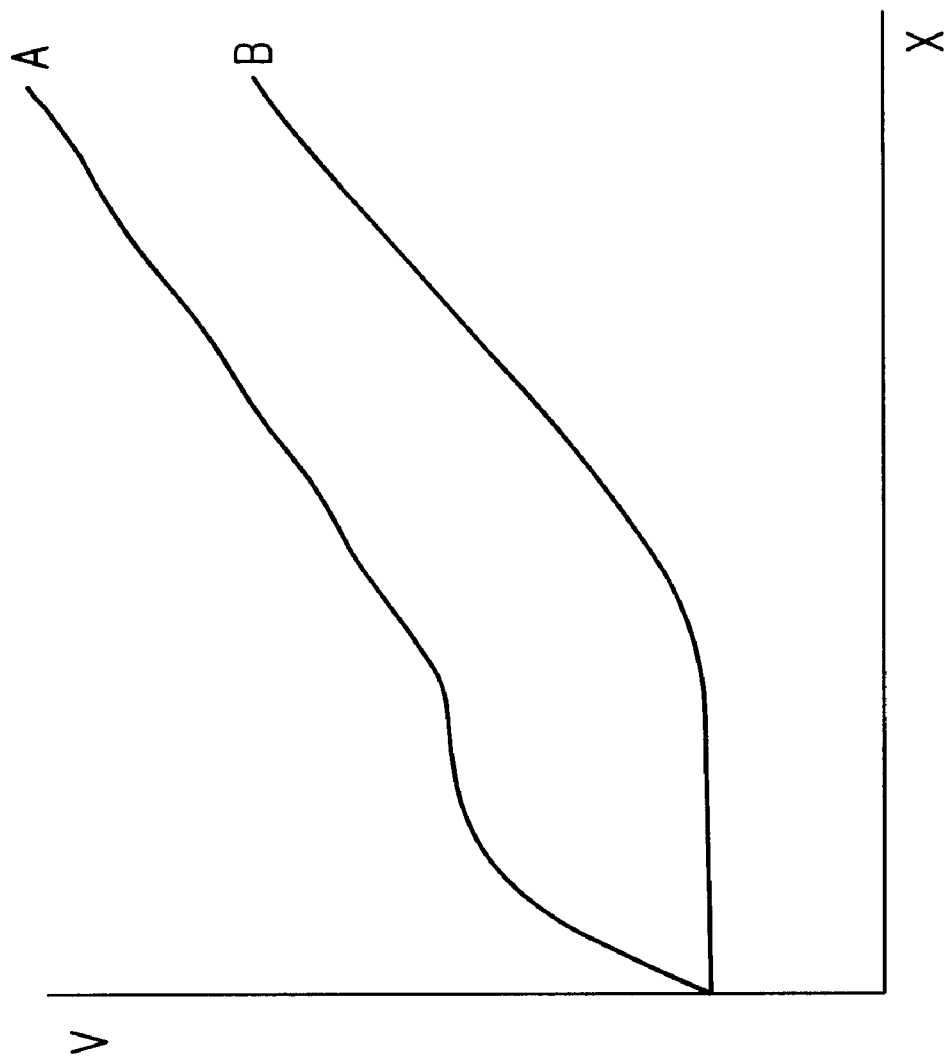
FIG. 3C is a graph showing the voltage at the cross-section at the center of the MOSFET cell as a function of the distance below the surface of the silicon.
Figure 12:
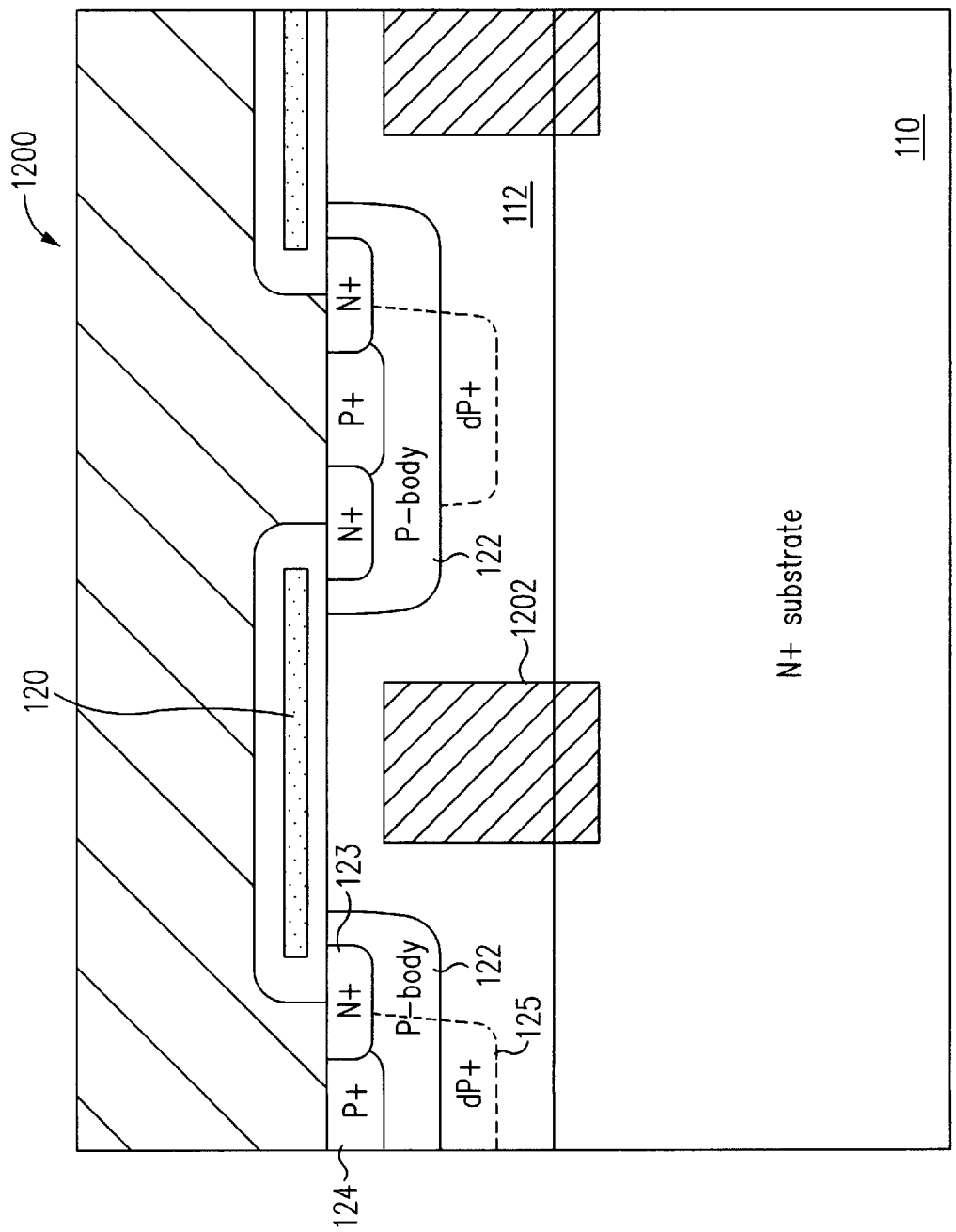
FIG. 12 is a cross-sectional view of a planar DMOSFET which includes a plug extending up into the JFET region under the gate and down into the substrate.
Figure 13:
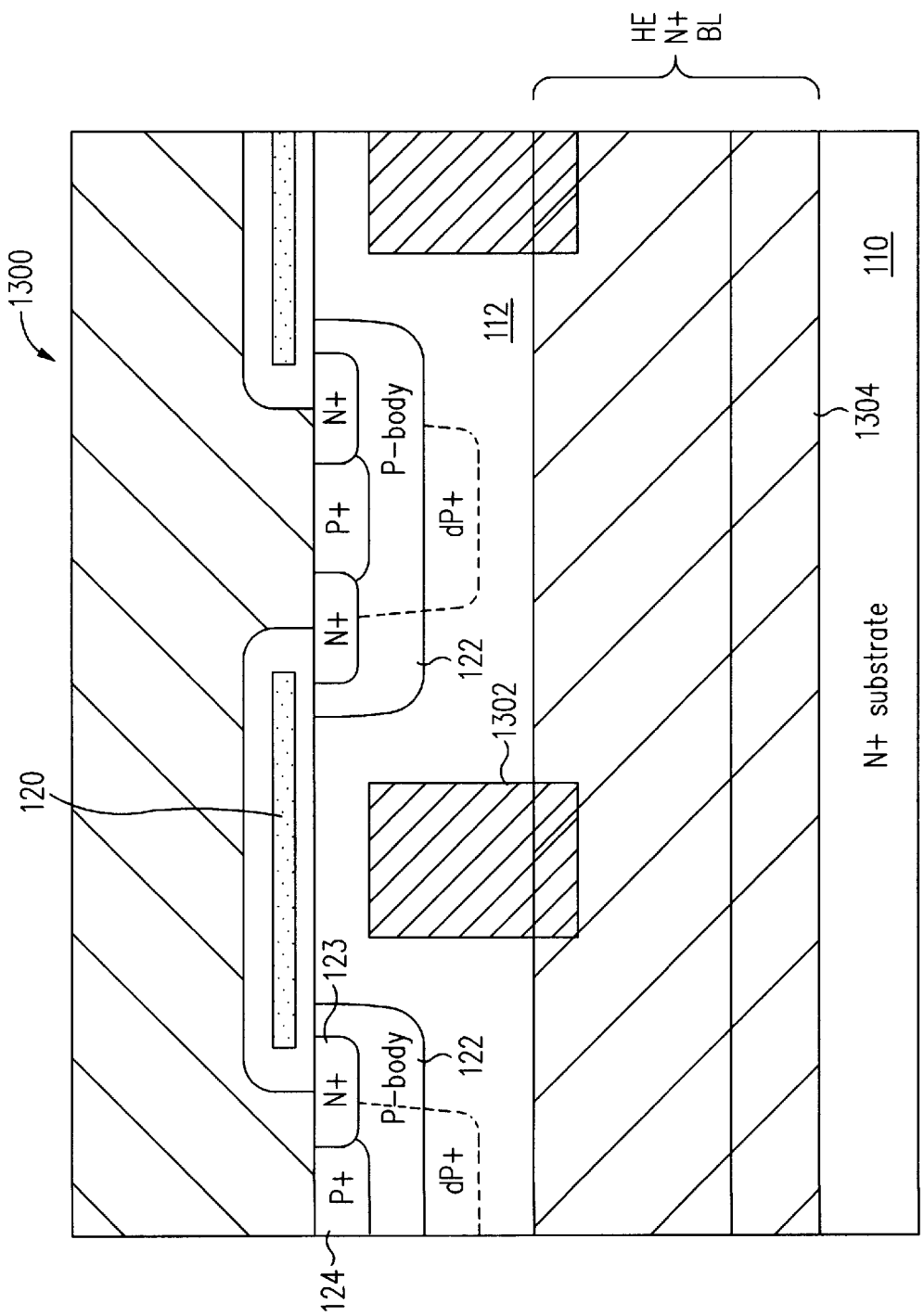
FIG. 13 is a cross-sectional view of a MOSFET similar to MOSFET of FIG. 12 but which includes a uniform buried layer in addition to the plug.

MOSFET 1200 shown in FIG. 12 is similar to the planar DMOSFET 100 of FIG. 1A, but MOSFET 1200 includes an N-type plug 1202 extending up into the JFET region under the gate 120 and down into the N+ substrate 110. MOSFET 1200 is distinguishable over the device described in the above-referenced U.S. Pat. No. 4,642,666 in that plug 1202 extends to a level below the P-body 122 and into the N+ substrate 110, and plug 1202 has a dopant concentration that decreases laterally from the center of plug 1202 (below the center of gate 120) toward P-body 122. MOSFET 1300 of FIG. 13 is similar to MOSFET 1200 but it includes an N-type uniform buried layer 1304, and an N-type plug 1302 which overlaps uniform buried layer 1304 but stops short of the N+ substrate 110.

Figure 14C:
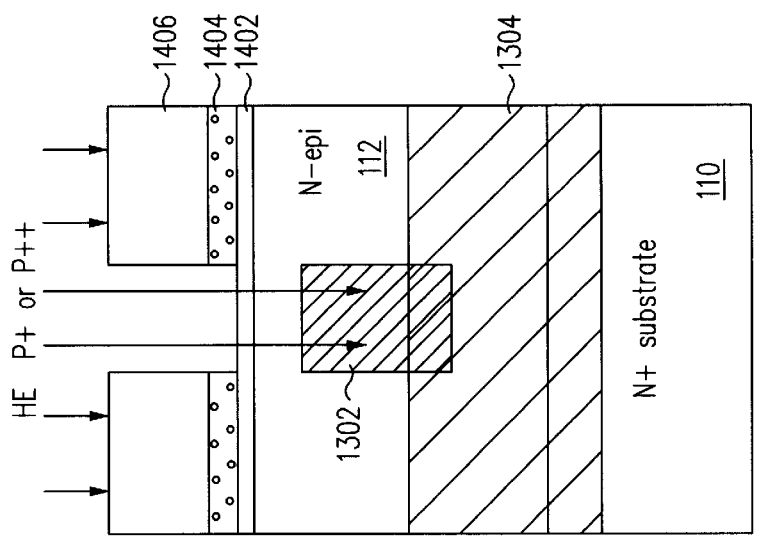
FIGS. 14A–14H illustrate the steps of a process for forming the MOSFET of FIG. 13.
Figure 14B:
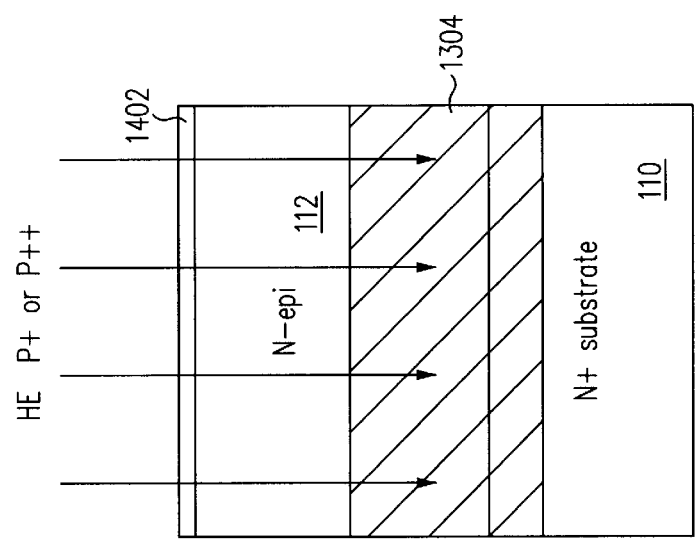
Figure 14A:
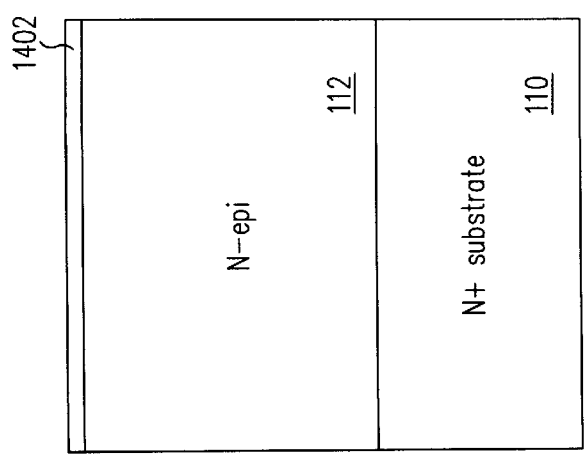
Figure 14F:
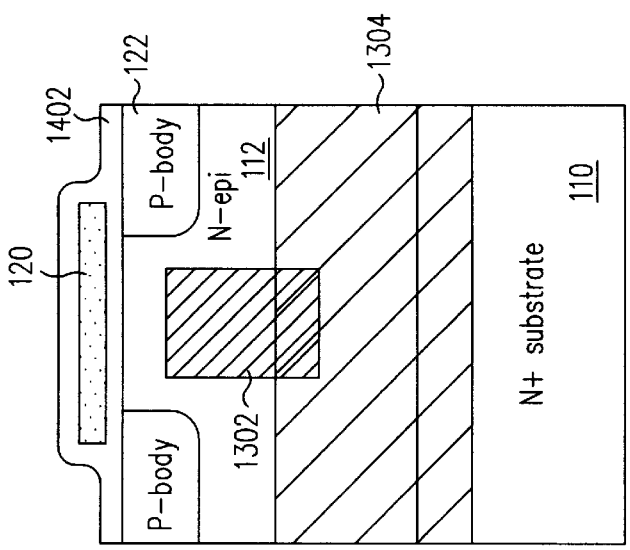
Figure 14E:
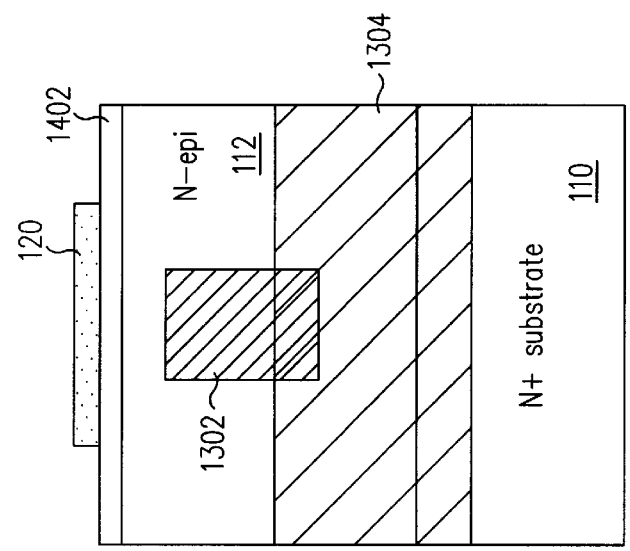
Figure 14D:
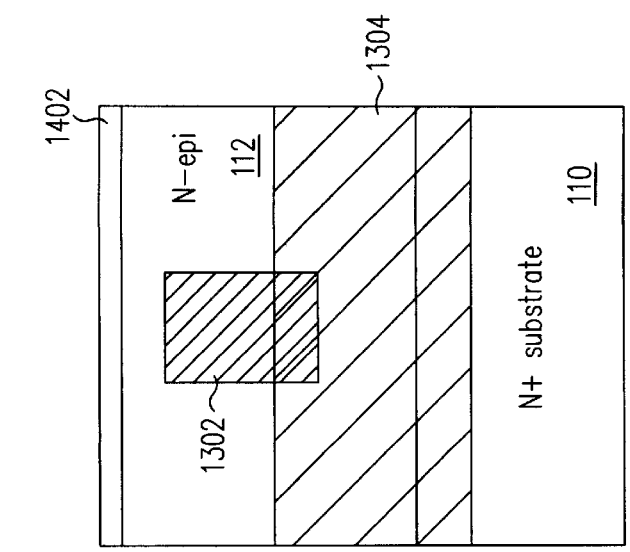
Figure 14H:
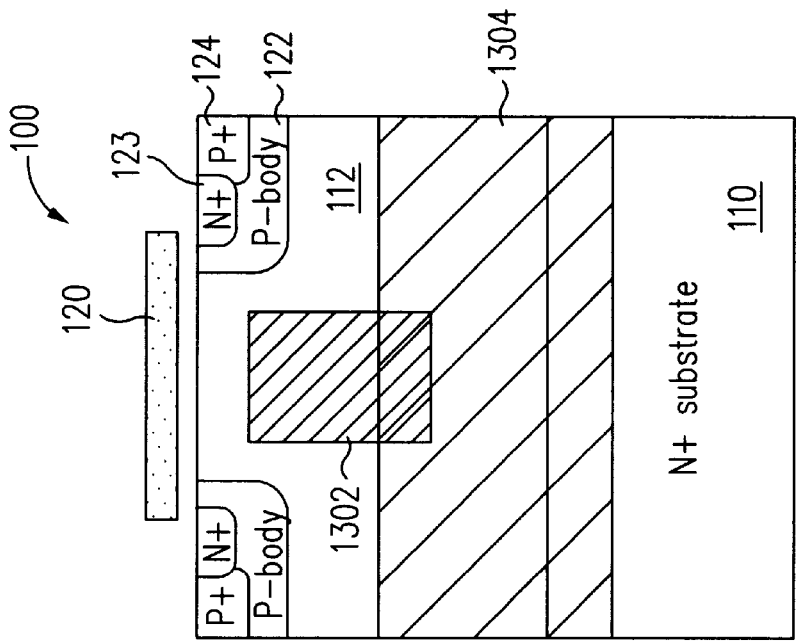
Figure 14G:
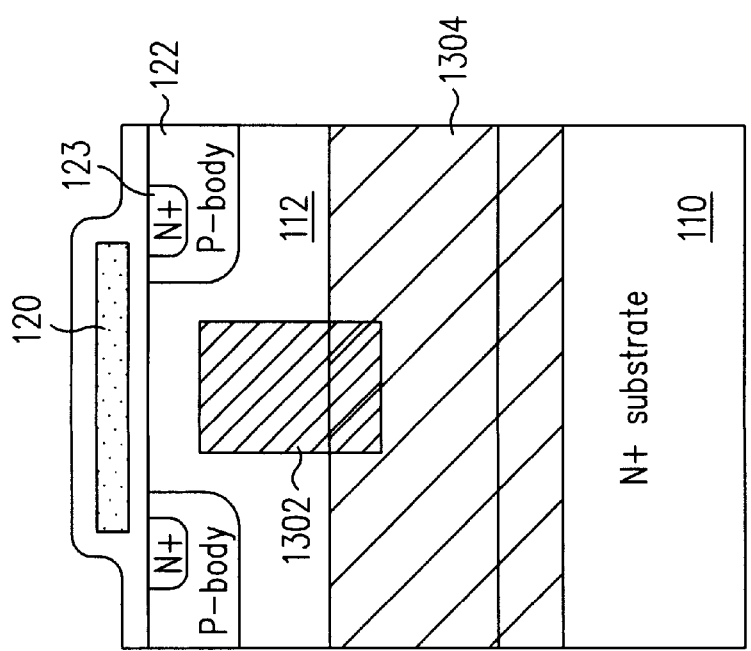

A process for forming MOSFET 1300 is illustrated in FIGS. 14A–14H. Following the growth of a gate oxide layer 1402 on N-epi layer 112 (FIG. 14A), high-energy phosphorus is implanted to form uniform buried layer 1304 (FIG. 14B) at a dose of $1 \times 10^{13}$ to $5 \times 10^{15}$ cm$^{-2}$ and an energy of 800 keV to 3 MeV. A silicon nitride layer 1404 and photoresist layer 1406 are formed and patterned as shown in FIG. 14C, and high-energy phosphorus is implanted at a dose of $5 \times 10^{12}$ to $1 \times 10^{15}$ cm$^{-2}$ and an energy of 300 keV to 2 MeV to form plug 1302. In general, plug 1302 is implanted at an energy less than the uniform buried layer 1304. Layers 1404 and 1406 are stripped, and polysilicon gate 120 is formed (as described above) over gate oxide layer 1402 (FIG. 14E). P-body 122 and N+ source region 123 are implanted, using gate 120 as a mask (FIGS. 14F and 14G), and P+ body contact region is implanted (FIG. 14H). One distinction of MOSFET 1300 over MOSFETs 402 and 702, containing a true conformal buried layer, is that the doping concentration of plug 1302 can be different from the doping concentration of uniform buried layer 1304. In this way, the electric field at the silicon surface and the on-resistance of the JFET region of MOSFET 1300 can be adjusted independently of the on-resistance and avalanche breakdown in regions further down in MOSFET 1300.

Figures 15D, 15E, 15F:
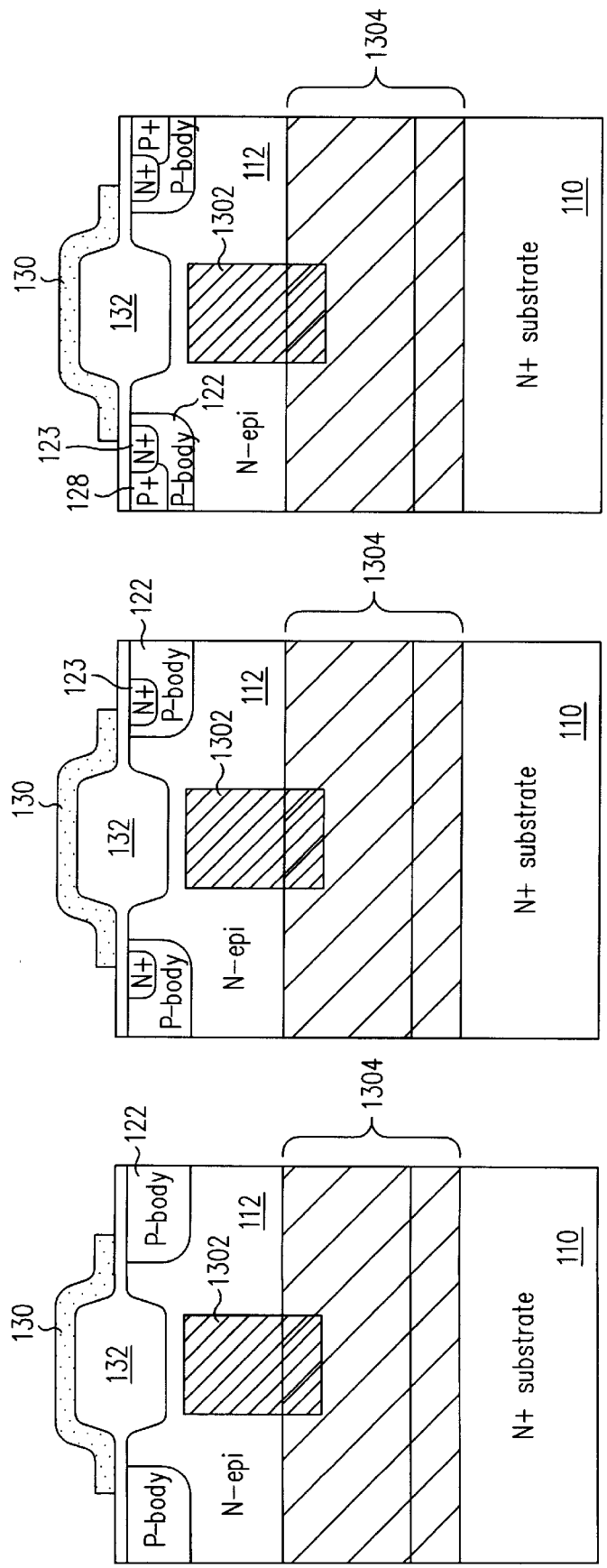

FIGS. 15A–15F illustrate a process sequence for forming a terrace-gated MOSFET 1500 which is similar to MOSFET 402 of FIG. 4 but contains a uniform buried layer and plug instead of the conformal buried layer 404. The process starts with the steps illustrated in FIGS. 14A and 14B. As shown in FIG. 15A, starting at the step illustrated in FIG. 14C, photoresist layer 1406 is stripped, and a thick oxide layer 132 is grown in the manner described in connection with FIG. 8C. This yields the structure illustrated in FIG. 15B. Nitride layer 1404 is stripped, resulting in the structure of FIG. 15C. As shown in Fig. Polysilicon gate 120 is formed (FIG. 15D), and P-body 122, N+ source region 123, and P+ body contact region 128 are implanted (FIGS. 15E and 15F).

The embodiments described above are illustrative only. Many alternative embodiment within the scope of this invention will be apparent to those skilled in the art. For example, the methods described herein can be used to produce a P-channel device instead of the N-channel device shown, by exchanging the P-type and N-type regions and exchanging phosphorus for boron implants and vice versa. In general, implant energies may be reduced by about 40% when boron instead of phosphorus is implanted to form a P-type conformal buried layer. Alternatively, the boron may be implanted at the same energy as the phosphorus to obtain a deeper conformal buried layer and thereby to increase the breakdown voltage of the MOSFET.

We claim:

1. A vertical power MOSFET comprising:
   a semiconductor substrate of a first conductivity type;
   a lightly doped epitaxial layer generally of the first conductivity type overlying the substrate, the lightly doped layer being doped relatively lightly with dopant of the first conductivity type as compared with the substrate;
   a MOSFET cell comprising:
      a body region of a second conductivity type opposite to the first conductivity type within the epitaxial layer, the body region being located adjacent a surface of the epitaxial layer and enclosing and defining a central portion of the MOSFET cell;
      a source region of the first conductivity type enclosed by and forming a junction with the body region, a portion of the body region adjacent the surface of the epitaxial layer comprising a channel region;
   a drain region of the first conductivity type comprising the substrate;
   a gate separated from the channel region by a dielectric layer; and
   a buried layer located within the epitaxial layer and extending into the substrate, the buried layer being of the first conductivity type and having a higher concentration of a dopant of the first conductivity type than a remaining portion of the epitaxial layer, the buried layer having an upper boundary within the epitaxial layer, the upper boundary having a shape such the upper boundary is at a first level below the body region and at a second level at a center of the MOSFET cell, the second level being above the first level.

2. The vertical power MOSFET of claim 1 wherein at least a portion of the upper boundary of the buried layer has a shape that generally conforms to a shape of the body region.

3. The vertical power MOSFET of claim 1 wherein the central portion of the MOSFET cell comprises an oxide layer, the oxide layer being thicker than the dielectric layer, at least a portion of the gate extending over the oxide layer.

4. The vertical power MOSFET of claim 3 wherein the oxide layer has tapered edges.

5. The vertical power MOSFET of claim 4 wherein the oxide layer has substantially vertical edges.

6. The vertical power MOSFET of claim 3 wherein the buried layer extends to a bottom surface of the oxide layer.

7. The vertical power MOSFET of claim 3 wherein the buried layer is separated from a bottom surface of the oxide layer.

8. The vertical power MOSFET of claim 1 wherein a lower boundary of the buried layer has a shape such that the lower boundary is within the epitaxial layer at the center of the MOSFET cell.

9. The vertical power MOSFET of claim 1 wherein the buried layer comprises a generally horizontal layer and a plug portion extending upward from the generally horizontal layer, the plug portion being located below the central portion of the MOSFET cell, a bottom boundary of the generally horizontal layer being located entirely within the substrate.

10. The vertical power MOSFET of claim 9 wherein the central portion of the MOSFET cell comprises an oxide layer, the oxide layer being thicker than the dielectric layer, at least a portion of the gate extending over the oxide layer.

11. The vertical power MOSFET of claim 10 wherein the buried layer is separated from a bottom surface of the oxide layer.

12. A process of forming a vertical power MOSFET comprising:

providing a semiconductor substrate, the semiconductor substrate being doped with atoms of a first conductivity type to a first concentration level;

forming an epitaxial layer on a surface of the substrate;

doping the epitaxial layer with atoms of the first conductivity type to a second concentration level lower than the first concentration level;

forming a thin oxide layer at a first portion of a surface of the epitaxial layer;

forming a thick layer at a second portion of the surface of the epitaxial layer;

forming a gate layer over the oxide layers;

etching the gate layer so as to leave a gate, a first portion of the gate lying over at least a portion of the thick layer and a second portion of the gate lying over a portion of the thin oxide layer;

implanting a first dopant of the first conductivity type into the epitaxial layer through the gate, the thick layer and the thin oxide layer;

heating the substrate and the epitaxial layer so as to diffuse the dopant, a portion of the dopant lying within the substrate at the completion of the heating;

implanting a second dopant of a second conductivity type opposite to the first conductivity type to form a body region; and implanting a third dopant of the first conductivity type to form a source region.

13. The process of claim 12 wherein the step of implanting a first dopant comprises implanting the first dopant at an energy of from 500 keV to 3 MeV.

14. The process of claim 13 wherein the step of implanting a first dopant comprises implanting the first dopant at an energy of from 1 MeV to 1.5 MeV.

15. The process of claim 12 wherein the step of forming a thick layer comprises:

forming a mask layer over the epitaxial layer;

etching the mask layer to form an opening therein; and thermally treating the epitaxial layer so as to grow a thick oxide layer in a region exposed by the opening.

16. The process of claim 15 wherein the step of forming a mask layer comprises forming a nitride layer on the thin oxide layer.

17. The process of claim 12 wherein the step of forming a thick layer comprises:

forming an extended thick layer over at least a portion of the epitaxial layer; and etching the extended thick oxide layer so as to remove a portion thereof leaving the thick oxide layer.

18. A process of forming a vertical power MOSFET comprising:

providing a semiconductor substrate, the semiconductor substrate being doped with atoms of a first conductivity type to a first concentration level;

forming an epitaxial layer on a surface of the substrate, the epitaxial layer being doped with atoms of the first conductivity type to a second concentration level lower than the first concentration level;

forming an oxide layer at a first portion of a surface of the epitaxial layer;

implanting a first dopant of the first conductivity type into the epitaxial layer so as to form a horizontal buried layer;

forming a mask layer over the epitaxial layer;

forming an opening in the mask layer;

implanting a second dopant of the first conductivity type through the opening into the epitaxial so as to form a plug in the epitaxial layer, the plug overlapping the horizontal buried layer;

heating the substrate and the epitaxial layer so as to diffuse the dopants, a portion of the dopants lying within the substrate at the completion of the heating;

forming a gate over the oxide layer;

implanting a second dopant of a second conductivity type opposite to the first conductivity type to form a body region; and implanting a third dopant of the first conductivity type to form a source region.

19. The process of claim 18 comprising the further step of forming a thick layer at a surface of the epitaxial layer, the thick layer substantially overlying the plug.

20. The process of claim 19 wherein the step of forming a thick layer comprises:

forming a second mask layer over the epitaxial layer;

etching the second mask layer to form an opening therein; and thermally treating the epitaxial layer so as to grow a thick oxide layer in a region exposed by the opening.

21. The process of claim 20 wherein the step of forming a second mask layer comprises forming a nitride layer.

* * * * *

UNITED STATES PATENT AND TRADEMARK OFFICE
CERTIFICATE OF CORRECTION

PATENT NO.    : 6,072,216
DATED         : June 6, 2000
INVENTOR(S)   : Williams et al.

It is certified that error appears in the above-identified patent and that said Letters Patent is hereby corrected as shown below:

Column 1,
Line 18, please delete "condiction" and insert -- condition --.

Column 8,
Line 17, please delete "cinter" and insert -- center --.

Column 9,
Line 6, please delete "is" and insert -- has --.

Signed and Sealed this

Twenty-seventh Day of May, 2003

JAMES E. ROGAN
*Director of the United States Patent and Trademark Office*